United States Patent
Song et al.

(10) Patent No.: US 9,343,158 B2
(45) Date of Patent: May 17, 2016

(54) METHODS OF PROGRAMMING MULTI-LEVEL CELL NONVOLATILE MEMORY DEVICES AND DEVICES SO OPERATING

(71) Applicants: Jung-Ho Song, Suwon-si (KR); Su-Yong Kim, Yongin-si (KR); Sang-Won Hwang, Suwon-si (KR)

(72) Inventors: Jung-Ho Song, Suwon-si (KR); Su-Yong Kim, Yongin-si (KR); Sang-Won Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 33 days.

(21) Appl. No.: 14/165,835

(22) Filed: Jan. 28, 2014

(65) Prior Publication Data

US 2014/0211565 A1    Jul. 31, 2014

(30) Foreign Application Priority Data

Jan. 29, 2013    (KR) .................. 10-2013-0009836

(51) Int. Cl.
| | | |
|---|---|---|
| G11C 11/34 | (2006.01) | |
| G11C 16/14 | (2006.01) | |
| G11C 11/56 | (2006.01) | |
| G11C 16/04 | (2006.01) | |
| G11C 16/34 | (2006.01) | |

(52) U.S. Cl.
CPC ............ *G11C 16/14* (2013.01); *G11C 11/5628* (2013.01); *G11C 16/0483* (2013.01); *G11C 16/3418* (2013.01); *G11C 16/3459* (2013.01)

(58) Field of Classification Search
USPC ............. 365/185.03, 185.17, 185.18, 185.19, 365/185.22, 185.29, 195.33
See application file for complete search history.

(56) References Cited

U.S. PATENT DOCUMENTS

| | | | |
|---|---|---|---|
| 6,570,787 B1 | 5/2003 | Wang et al. | |
| 7,349,263 B2 * | 3/2008 | Kim et al. .............. | 365/185.19 |
| 7,688,633 B2 | 3/2010 | Martinelli et al. | |
| 7,826,262 B2 | 11/2010 | Wu et al. | |
| 7,929,351 B2 * | 4/2011 | Seol et al. .............. | 365/185.22 |
| 8,203,878 B2 * | 6/2012 | Baek et al. ............. | 365/185.03 |
| 8,238,164 B2 * | 8/2012 | Kim et al. .............. | 365/185.22 |
| 8,254,181 B2 * | 8/2012 | Hwang et al. ........... | 365/185.17 |
| 8,385,118 B2 * | 2/2013 | Yip ......................... | 365/185.03 |
| 8,665,649 B2 * | 3/2014 | Park ....................... | 365/185.19 |
| 8,879,320 B2 * | 11/2014 | Lee et al. ............... | 365/185.03 |
| 8,976,599 B2 * | 3/2015 | Lee ......................... | 365/185.22 |
| 2005/0047223 A1 | 3/2005 | Chen et al. | |
| 2006/0291290 A1 | 12/2006 | Kim et al. | |
| 2010/0265772 A1 | 10/2010 | Roohparvar et al. | |
| 2011/0019470 A1 | 1/2011 | Shibata et al. | |
| 2011/0044102 A1 | 2/2011 | Dong et al. | |
| 2011/0063917 A1 | 3/2011 | Shiino et al. | |
| 2011/0255611 A1 | 10/2011 | Caveney et al. | |
| 2012/0020153 A1 | 1/2012 | Joo | |

* cited by examiner

*Primary Examiner* — Trong Phan
(74) *Attorney, Agent, or Firm* — Myers Bigel & Sibley, P.A.

(57) ABSTRACT

To program in a nonvolatile memory device include a plurality of memory cells that are programmed into multiple states through at least two program steps, a primary program is performed from an erase level to a first target level with respect to the memory cells coupled to a selected word line A preprogram is performed from the erase level to a preprogram level in association with the primary program with respect to the memory cells coupled to the selected word line, where the preprogram level is larger than the erase level and smaller than the first target level A secondary program is performed from the preprogram level to a second target level with respect to the preprogrammed memory cells coupled to the selected word line.

19 Claims, 20 Drawing Sheets

METHODS OF PROGRAMMING MULTI-LEVEL CELL NONVOLATILE MEMORY DEVICES AND DEVICES SO OPERATING

CROSS-REFERENCE TO RELATED APPLICATION

This application claims priority under 35 USC §119 to Korean Patent Application No. 10-2013-0009836, filed on Jan. 29, 2013, in the Korean Intellectual Property Office (KIPO), the contents of which are herein incorporated by reference in their entirety.

FIELD

The present inventive concept generally relates to memory devices, and more particularly to multi-level nonvolatile memory devices.

BACKGROUND

Semiconductor memory devices can be classified into volatile memory devices and nonvolatile memory devices based on whether data stored therein is retained after power is removed from the device. The nonvolatile memory device can include an Electrically Erasable and Programmable Read Only Memory (EEPROM).

The EEPROM may operate in a program mode to write data to a memory cell, a read mode to read out the data stored in the memory cell and an erase mode to initialize a memory cell by erasing the stored data. In general, according to the Incremental Step Pulse Program (ISPP) scheme, the verify operation and reprogram operation after the verify operation can be repeated until the verification is completed.

Programming of an Multi-Level Cell (MLC) provides for the storage of 2 (or more) bits of data in one memory cell. If N bits are stored in one MLC, the threshold voltage distribution of each MLC can be subdivided into $2^N$ where each threshold voltage distribution expresses N bit data. For example, when 2 bits of data are stored in one memory cell, the threshold voltage distribution of the memory cell is subdivided into four levels. When a bit value '0' is written in the MLC represents program allow and a bit value '1' represents program inhibit, the states of the MLC having four threshold voltages may be represented as '11', '10', '01' and '00' according to the descending order of the threshold voltage. In this case, '11' represents the state of the MLC which remains erased without being programmed.

At this time, a floating gate coupling may be applied to adjacent word lines while performing each step, so distribution distortion may occur. If the distribution distortion becomes severe, the program may fail, causing a read error.

SUMMARY

Some example embodiments provide a method of programming in a multi-level nonvolatile memory device capable of minimizing influence of the word line coupling by reducing the maximum variation range of threshold voltage before and after a program by using a preprogram.

Some example embodiments provide a method of programming in a multi-level nonvolatile memory device capable of adopting a preprogram scheme considering a word line coupling gain and a time overhead.

According to example embodiments, a method of programming in a nonvolatile memory device is provide, where the nonvolatile memory device include a plurality of memory cells that are programmed into multiple states through at least two program steps. The method includes performing a primary program from an erase level to a first target level with respect to the memory cells coupled to a selected word line; performing a preprogram from the erase level to a preprogram level in association with the primary program with respect to the memory cells coupled to the selected word line, the preprogram level being larger than the erase level and smaller than the first target level; and performing a secondary program from the preprogram level to a second target level with respect to the preprogrammed memory cells coupled to the selected word line.

A distribution range of a threshold voltage of preprogrammed memory cells may be larger than a word line coupling gain and smaller than a value that is obtained by subtracting a word line coupling limit margin width from a maximum value of the second target level.

The preprogram may be performed using a program pulse of a first program loop for performing the primary program.

The preprogram may be performed using a preprogram pulse that is added before a program pulse of a first program loop for performing the primary program.

The preprogram may be performed using a first program loop for performing the primary program.

The preprogram may be performed using one or more preprogram loops that are added before a first program loop for performing the primary program.

Each preprogram loop includes programming the preprogrammed memory cells using a preprogram pulse and verifying program states of the preprogrammed memory cells using a verify pulse, and the preprogram may be inhibited with respect to the preprogrammed memory cells having a threshold voltage level higher than a verify level of the verify pulse.

The method may further includes performing the primary program and the preprogram with respect to the memory cells coupled to an adjacent word line, after performing the primary program and the preprogram with respect to the memory cells coupled to an adjacent word line and before performing the secondary program with respect to the preprogrammed memory cells coupled to the selected word line.

The method may further includes performing the secondary program with respect to the preprogrammed memory cells coupled to the adjacent word line, after programming is completed with respect to the memory cells coupled to the selected word line.

According to example embodiments, a method of programming in a nonvolatile memory device is provided, where the nonvolatile memory device includes a plurality of memory cells that are programmed into multiple states through at least two program steps. The method includes performing a primary program from an erase level to a first target level with respect to the memory cells coupled to a first word line; performing a preprogram from the erase level to a preprogram level in association with the primary program with respect to the memory cells coupled to the first word line, the preprogram level being larger than the erase level and smaller than the first target level; performing the primary program with respect to the memory cells coupled to a second word line adjacent to the first word line; and performing the preprogram with respect to the memory cells coupled to the second word line.

The method may further includes performing a secondary program from the preprogram level to a second target level with respect to the preprogrammed memory cells coupled to the first word line, after performing the primary program and the preprogram with respect to the memory cells coupled to the second word line.

As described above, according to the programming method of the multi-level nonvolatile memory device of the example embodiments, variation of threshold voltage before and after the program can be reduced by the preprogram. That is, influence of the word line coupling can be reduced, thereby reducing the distribution distortion and read error.

Effects of the example embodiments may not be limited to the above, and other effects may be clearly comprehended to those skilled in the art within the scope of the example embodiments.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
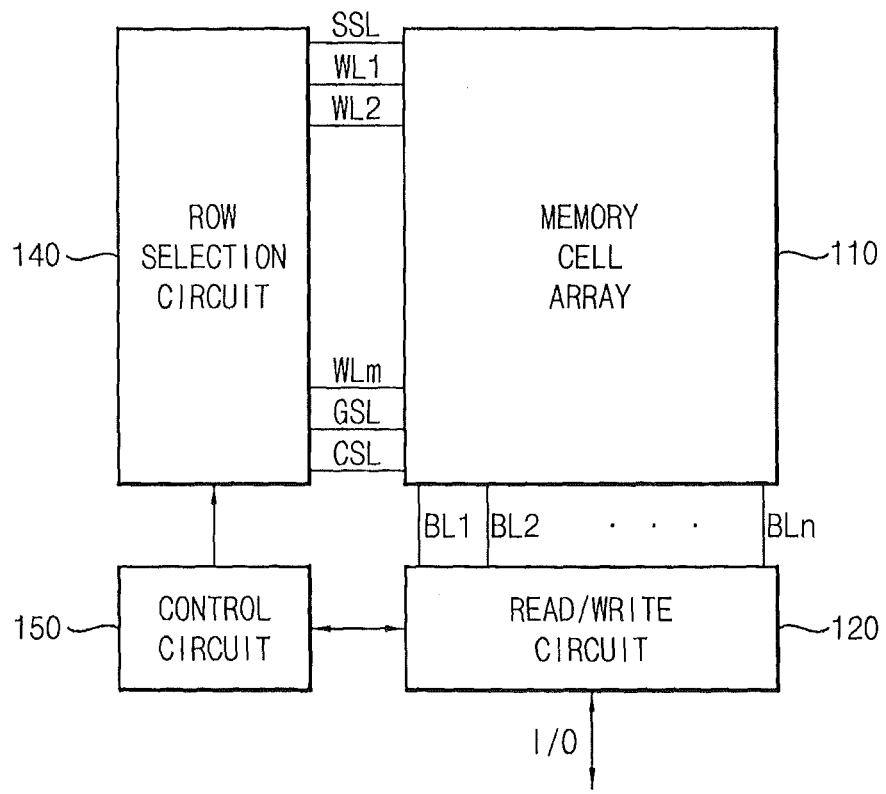
FIG. 1 is a block diagram illustrating a nonvolatile memory device according to an example embodiment.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Furthermore, the phrase "word line coupling" may be used herein to refer to effects that are unintended due to the electrical influence of an action on an unaddressed element, such as a multi-level memory cell (MLC) that is not the target of a programming operation. In such usage, therefore, the phrase "word line coupling" will be understood not to mean that the unaddressed element is "coupled" to a wordline, for example, where the wordline is actually connected to an adjacent MLC and is used to properly address the adjacent MLC.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Aspects of the present disclosure are described herein with reference to flowchart illustrations and/or block diagrams of methods, devices (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus, such as a memory controller, to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

It will be understood that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
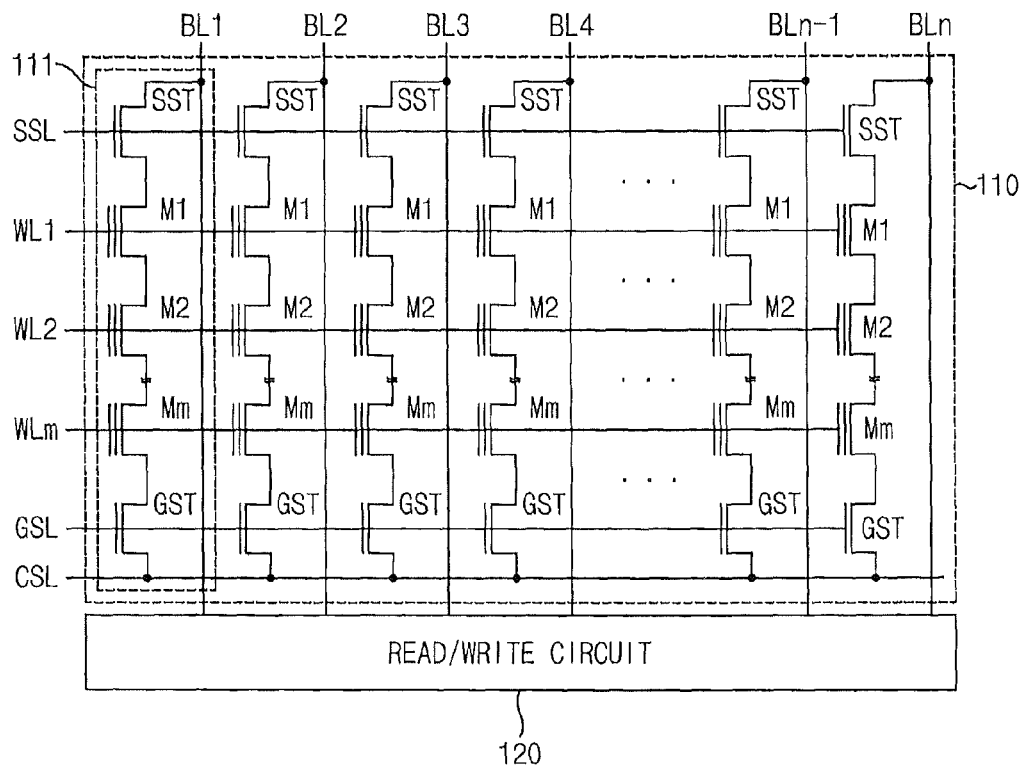
FIG. 2 is a circuit diagram illustrating a memory cell array in the nonvolatile memory device of FIG. 1.

FIG. 1 is a block diagram illustrating a nonvolatile memory device according to an example embodiment, and FIG. 2 is a circuit diagram illustrating a memory cell array in the nonvolatile memory device of FIG. 1.

Referring to FIGS. 1 and 2, a flash memory device 100 according to the example embodiment may include a memory cell array 110 to store data, a read/write circuit 120, a row selection circuit 140 and a control circuit 150.

The memory cell that stores N-bit data information for each cell, where N is an integer greater than one, is referred to as a multi-level cell (MLC). The memory cell array 110 may be divided into a main area to store general data and a spare region to store additional information (for example, flag information, error correction information, device information, a maker code, or page information) related to the main area and general data. The N-bit data may be stored in the main area and 1-bit data or N-bit data may be stored in the spare area.

The cell array 110 may include memory cells aligned in the form of a plurality of rows (or word lines) and a plurality of columns (or bit lines). The memory cells included in the cell array 110 may constitute a plurality of memory blocks. Each memory cell included in each memory block may have a NAND string structure as shown in FIG. 2. In example embodiments, the program operation of the multi-level cell flash memory having the NAND string structure will be described. However, the program operation to be described below may not be limited to the specific flash memory, but can be applied to various types of flash memories including the NOR structure.

Referring to FIG. 2, one memory block may include a plurality of strings corresponding to a plurality of columns or bit lines BL1 to BLn, respectively. Each string 111 may include a string select transistor SST, a plurality of memory cells M1 to Mm, and a ground select transistor GST. FIG. 2 shows an example in which one string select transistor SST and one ground select transistor GST are provided in one string. In each string, a drain of the string select transistor SST is connected to a corresponding bit line, a source of the ground select transistor GST may be connected to a common source line CSL. A plurality of memory cells M1 to Mm may be serially connected between a source of the string select transistor SST and a drain of the ground select transistor GST. Control gates of the memory cells aligned in the same row may be commonly connected to corresponding word lines WL1 to WL1m. The string select transistor SST may be controlled by voltage applied through the string select line SSL, and the ground select transistor GST may be controlled by voltage applied through the ground select line GSL. The memory cells M1 to Mm may be controlled by voltage applied through corresponding word lines WL1 to WL1m. Each of the memory cells connected to each of the word lines WL1 to WL1m may store data corresponding to one page or plural pages or may store data corresponding to a sub-page smaller than one page. The unit of the program executed in the memory cells connected to the word lines WL1 to WL1m may not be specifically limited, but variously modified and changed.

In example embodiments, the program or the read operation of the NAND flash memory may be performed in the unit of a page, and the erase operation for programmed data may be performed in the unit of a block including several pages. In the case of the multi-level cell where N-bit data are stored in each cell, the program operation for each bit can be independently performed by M times in maximum.

Referring again to FIG. 1, the control circuit 150 can control the overall operation related to the program, erase and read operations of the flash memory device 100. The data to be programmed may be loaded to the read/write circuit 120 through a buffer under the control of the control circuit 150. During programming, the control circuit 150 controls the row selection circuit 140 and the read/write circuit 120 so that program voltage Vpgm, pass voltage Vpass and 0V voltage are applied to the selected word line, the non-selected word lines, and a bulk formed with the memory cells, respectively.

The program voltage Vpgm may be generated according to the Incremental Step Pulse Program (ISPP) scheme. The level of the program voltage Vpgm may be gradually increased or decreased by a predetermined increment $\Delta V$ of voltage as the program loops are repeated. The number of times to apply the program voltage Vpgm, the voltage level and the voltage applying time used in each program loop may be variously modified or changed under the control of an external device (for example, a memory controller) or an internal device (for example, the control circuit 150).

In FIG. 1, the control circuit 150 may generate word line voltages (program voltage Vpgm, pass voltage Vpass, verify voltage Vvfy and read voltage Vread) to be supplied to each word line and voltage to be supplied to the bulk formed with the memory cells. The row selection circuit 140 may select one of the memory blocks (or sectors) of the memory cell array 110 or one of word lines of the selected memory block in response to the control of the control circuit 150. The row selection circuit 140 may supply the word line voltage to the selected word line or the non-selected word lines in response to the control of the control circuit 150.

The read/write circuit 120 is controlled by the control circuit 150 and may operate as a sense amplifier or a write driver according to the operation mode. For example, in the case of the verify read/normal read operation, the read/write circuit 120 may operate as the sense amplifier to read the data from the memory cell array 110. In the case of the normal read operation, the data read from the read/write circuit 120 is output to the external device (for example, the memory controller or the host) through the buffer. In contrast, in the case of the verify read operation, the read data may be supplied to a pass/fail verify circuit.

In the case of the program operation, the read/write circuit 120 may operate as the write driver that drives the bit lines according to data to be stored in the memory cell array 110. The read/write circuit 120 receives the data to be used for the memory cell array 110 from the buffer and drives the bit lines according to the input data. To this end, the read/write circuit 120 may be prepared as a plurality of page buffers corresponding to the columns (or bit lines) or row pairs (or bit line pairs).

When the memory cells connected to the selected word line are programmed, the program voltage Vpgm and the verify voltage Vvfy may be alternately applied to the selected word line. In the verify operation, the bit lines connected to the selected memory cells may be precharged. In addition, the voltage variation of the precharged bit lines may be detected through the corresponding page buffer. In the case of the verify read operation, the detected data may be supplied to the pass/fail verify circuit to determine the program success of the memory cells. As will be described below, the flash memory of the example embodiment may selectively perform the program verify operation under the control of the control circuit 150 upon the program operation.

Figure 3:
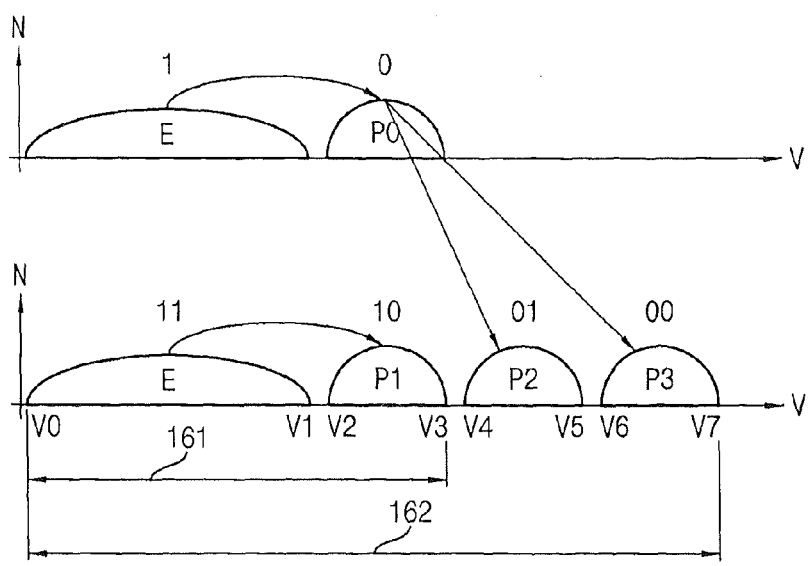
FIG. 3 is a diagram for describing a general 4-level multi-step program method.

FIG. 3 is a diagram for describing a general 4-level multi-step program method. FIG. 3 illustrates the threshold voltage distribution which can be formed according to the program of multi-level cells storing two bits. As an example embodiment, the threshold voltage distribution according to the 2-step program is schematically illustrated in FIG. 3, in which the transverse axis represents the threshold voltage (V) and the longitudinal axis represents the number of cells (N).

Referring to FIG. 3, the threshold voltage of the memory cell programmed with 2-bit data may correspond to one of states E (11), P1 (10), P2 (01) and P3 (00). Each data state may form a predetermined threshold voltage window. One memory cell may store N bits (for example, 2 bits) and each bit may be independently programmed through various program sequences.

For example, in case of the 2-bit MLC, the first bit (that is, least significant bit (LSB)) of the 2 bits may be primarily programmed. The threshold voltage distribution of the memory cells (V0-V1, V2-V3, V4-V5, and V6-V7), LSB of which is programmed through a first-step program, may have the two data states (E (1) and P0 (0)). Then, the most significant bit (MSB) of the 2 bits, except for the LSB, may be programmed through a second-step program. Each program step may include of a plurality of program loops. For example, the two data states (E and P0) programmed by the first-step program may be programmed to the four data states E, P1, P2 and P3 by the second-step program. In this way, the program sequence to the final threshold voltage through multiple steps of program operation is referred to as the multi-step program operation. The multi-level cell in which a plurality of bits may be stored for each cell may be programmed through the multi-step program operation having a plurality of program steps.

As shown in FIG. 3, the maximum threshold voltage variation 161 in the multi-step program operation is smaller than the maximum threshold voltage variation 162 in the one-step program operation. Thus, using the multi-step program scheme, the influence caused by the word line coupling may be reduced with respect to the cell coupled to the adjacent word line.

Figure 4:
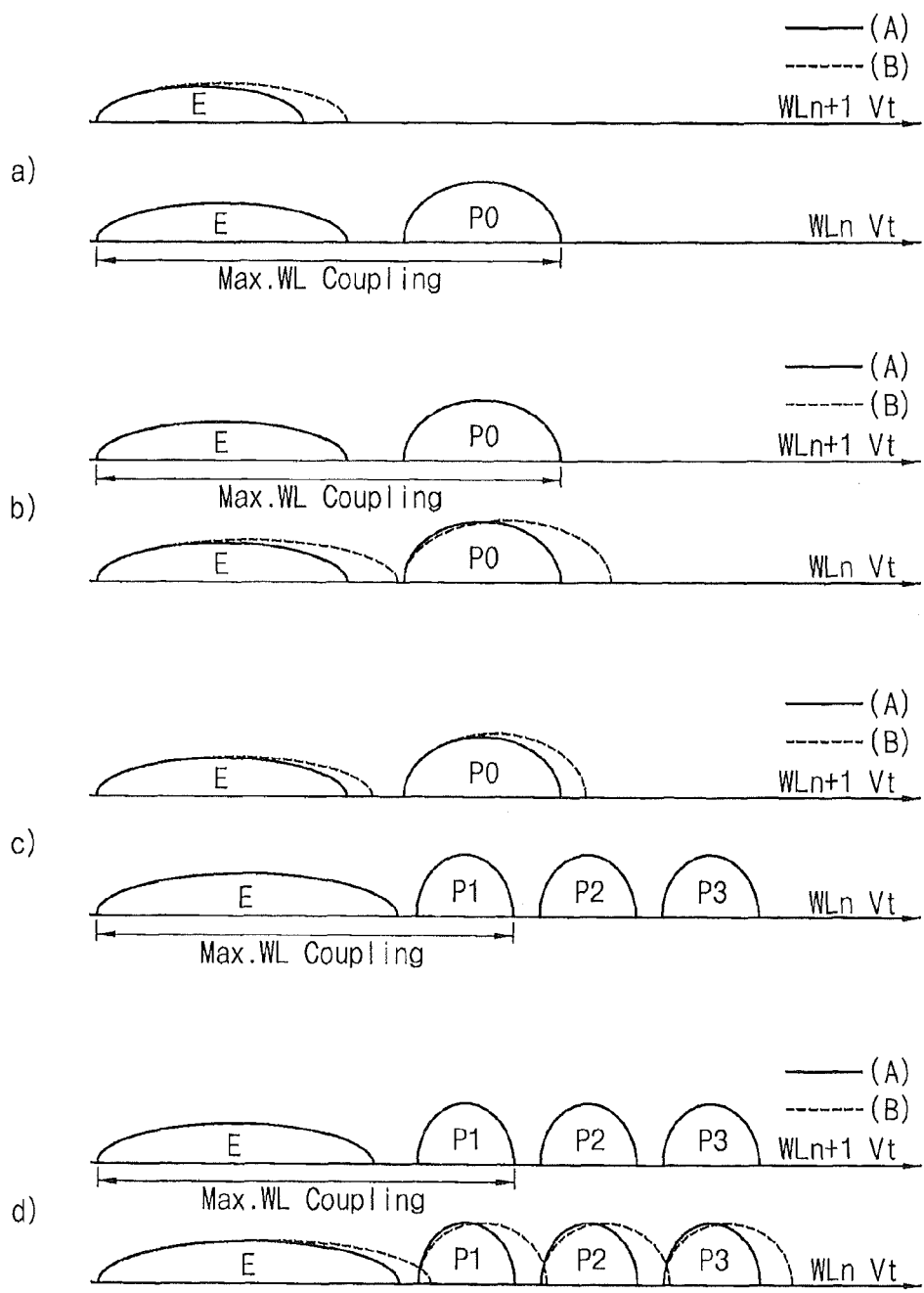
FIG. 4 is a diagram for describing variation of cell threshold voltage caused by a word line coupling in a multi-step program operation.

FIG. 4 is a diagram for describing variation of cell threshold voltage caused by a word line coupling in a multi-step program operation.

Referring to FIG. 4, as shown in a graph (a), if the word line WLn is primarily programmed (that is, the first-step program), the distribution range of the threshold voltage (Vth) is shifted from the E state to the P0 state. Thus, the program voltage applied to the word line WLn may exert an influence upon the word line WLn+1 due to the word line coupling Max.WL Coupling. Therefore, the distribution range of the threshold voltage of the cells having the erase state in which the floating gate is coupled to the word line WLn+1, that is, the distribution range of the threshold voltage of the cells having the E state (A) is expanded from the distribution range indicated by the solid line to the distribution range indicated by the dotted line (B). Then, as shown in a graph (b), if the word line WLn+1 is primarily programmed, the threshold voltage is shifted from the E state to the P0 state. Thus, the E state and the P0 state of the word line WLn are expanded to have the distribution range of the threshold voltage indicated by the dotted line due to the word line coupling. As shown in a graph (c), if the word line WLn is secondarily programmed (that is, the second-step program), the threshold voltage is shifted from the E state to the P1 state and from the P0 state to the P2 and P3 states. Thus, the E state and the P0 state of the cells connected to the word line WLn+1 are expanded from the distribution range of the threshold voltage indicated by the solid line to the distribution range of the threshold voltage indicated by the dotted line due to the word line coupling. Then, as shown in a graph (d), if the cells connected to the word line WLn+1 are secondarily programmed, the threshold voltage is shifted from the E state and the P0 state to the P1, P2 and P3 states, respectively. Thus, the threshold voltage of the cells connected to the word line WLn and having the E state and the P1, P2, and P3 states is expanded from the distribution range indicated by the solid line to the distribution range indicated by the dotted line due to the word line coupling. As shown in the drawings, if the E state and the P1, P2, and P3 states of the cells connected to the word line WLn are expanded as indicated by dotted lines so that that the distribution range of the adjacent level is intruded, the read error may occur upon the read operation of the corresponding cell. Thus, as appreciated by the present inventors, there is a need to diminish the influence of the word line coupling.

Figure 5:
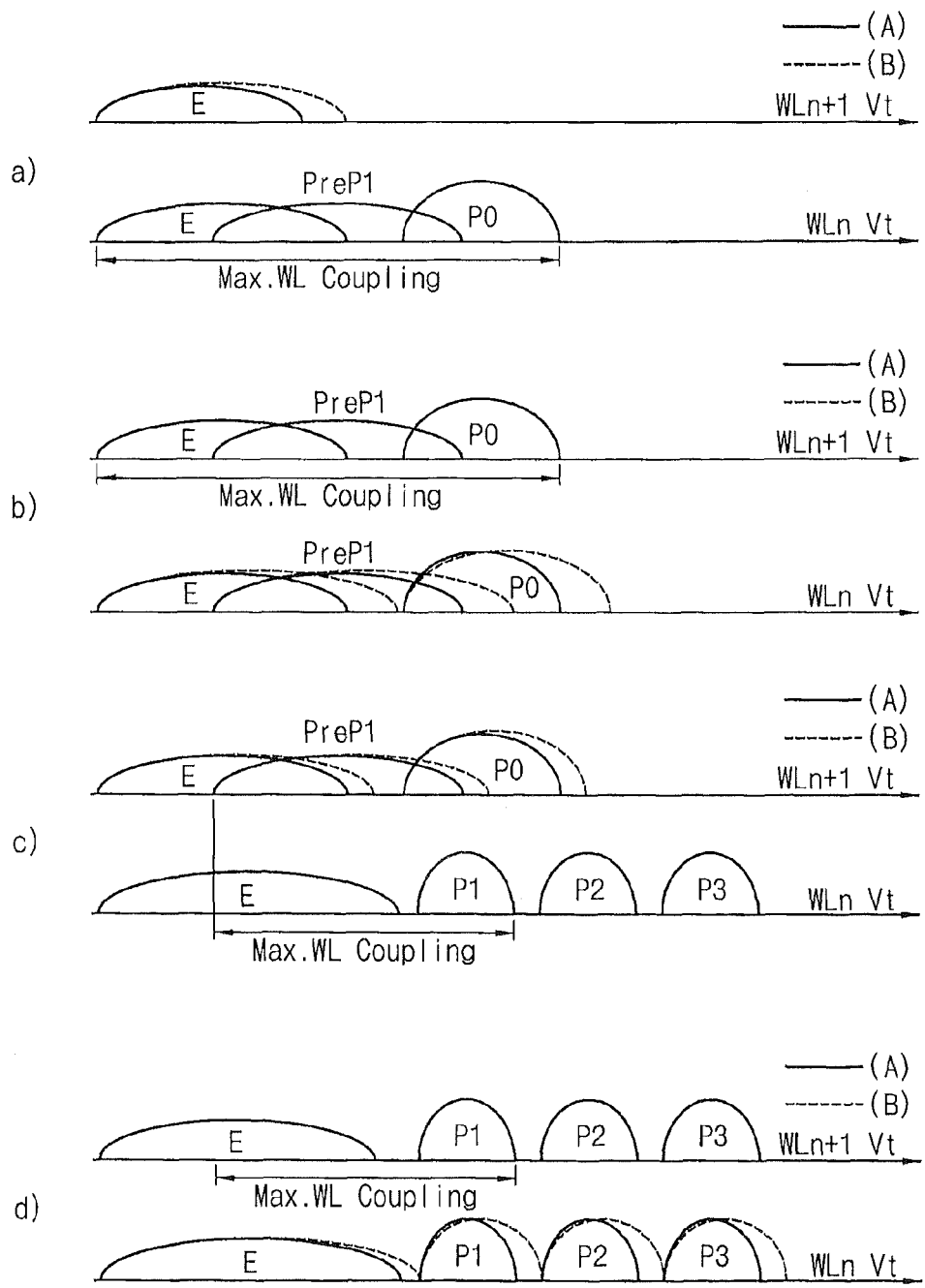
FIG. 5 is a diagram for describing a multi-step program operation employing a pulse preprogram scheme according to example embodiments.
Figure 6:
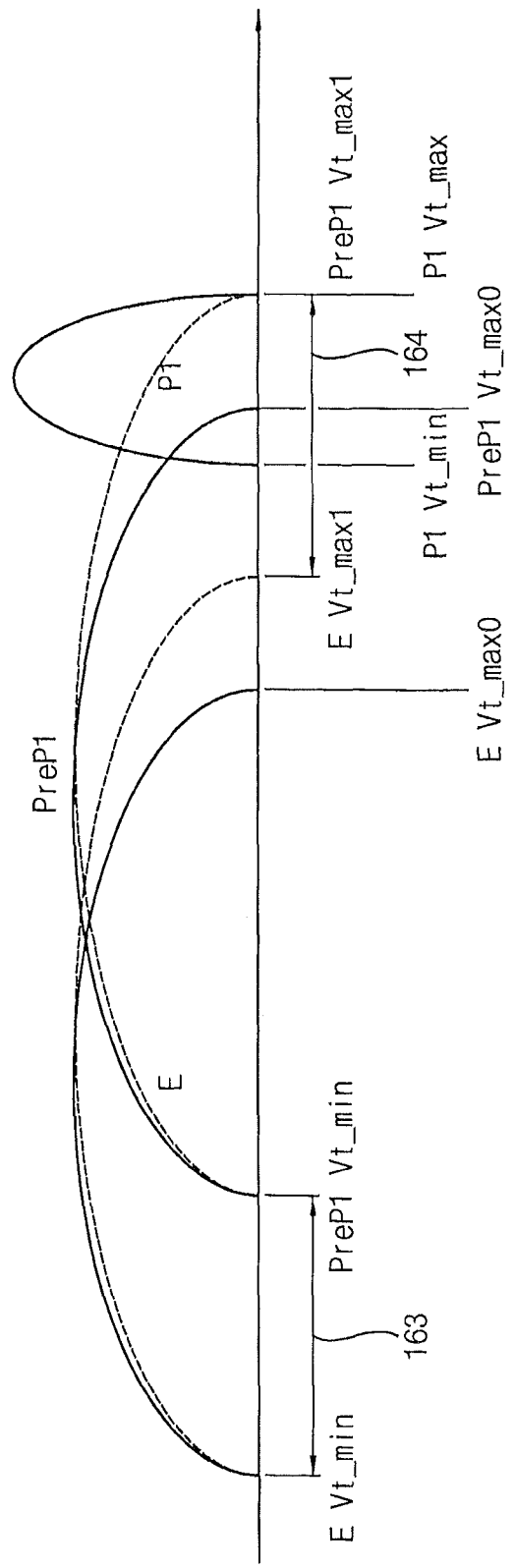
FIG. 6 is a diagram illustrating the distribution range of threshold voltage in a pulse preprogrammed state according to example embodiments.

FIG. 5 is a diagram for describing a multi-step program operation employing a pulse preprogram scheme according to example embodiments, and FIG. 6 is a diagram illustrating the distribution range of threshold voltage in a pulse preprogrammed state according to example embodiments.

According to the preprogram scheme of the example embodiment, in order to reduce the maximum variation (E→P0) of the threshold voltage upon the secondary program operation, the cell that requires the maximum variation of the threshold voltage is changed into the preprogram state having the distribution of the threshold voltage larger than the E state upon the primary program operation.

Referring to FIG. 5, as shown in a graph (a), the cells connected to the word line WLn (i.e., selected word line) are primarily programmed from the E state to the PreP1 state and the P0 state corresponding to a first target level. At this time, as shown in FIG. 6, the distribution range of the threshold voltage of the PreP1 state is at least larger than a word line coupling gain 163 and is set to the extent which is obtained by subtracting a word line coupling limit margin width 164 from the maximum value of the final target level. The word line coupling gain 163 is (PreP1 Vt_min)−(E Vt_min) and the word line coupling limit margin width 164 is (PreP1 Vt_max1)−(E Vt_max1). PreP1 Vt_max0 is the maximum threshold voltage in the programmed state, PreP1 Vt_max1 is the maximum threshold voltage caused by the word line coupling, PreP1 Vt_min is the minimum threshold voltage of the E state caused by the word line coupling, E Vt max0 is the maximum threshold voltage of the E state without affecting the word line coupling, P1 Vt_min is the minimum threshold voltage of the P1 state, and P1 Vt_max is the maximum threshold voltage of the P1 state.

Therefore, as shown in the graph (a), the E state of the cells coupled to the word line WLn+1 (i.e., adjacent word line) is expanded from the distribution range indicated by the solid line to the distribution range indicated by the dotted line due to the word line coupling. Then, as shown in a graph (b) of FIG. 5, if the cells coupled to the word line WLn+1 are primarily programmed, the distribution range of the threshold voltage is shifted from the E state to the PreP1 state and the P0 state. Thus, the E state, the PreP1 state and the P0 state of the cells coupled to the word line WLn are expanded from the distribution range indicated by the solid line to the distribution range indicated by the dotted line due to the word line coupling. As shown in a graph (c) of FIG. 5, the cells coupled to the word line WLn are programmed from the PreP1 state to the P1 state and from the P0 state to the P2 and P3 states through the secondary program step. The states P1, P2 and P3 corresponds to a second target level. Therefore, the maximum variation of the threshold voltage, that is, the maximum variation of the threshold voltage from the preprogram state to the P1 state may be reduced. Thus, the influence of the word line coupling can be reduced so that the E state and the P0 state of the cells coupled to the word line WLn+1 can be expanded from the distribution range indicated by the solid line to the distribution range indicated by the dotted line. At this time, the expansion degree of the word line WLn+1 caused by the coupling upon the PreP1-P1 program may be reduced as compared with the expansion degree of the word line WLn+1 caused by the coupling upon the E-P1 program. Then, as shown in a graph (d) of FIG. 5, if the cells coupled to the word line WLn+1 are secondarily programmed, the distribution range of the threshold voltage is shifted from the PreP1 state and the P0 state to the P1, P2 and P3 states. Thus, the maximum variation of the threshold voltage is reduced so that the influence caused by the word line coupling may be reduced. Thus, the distribution range of the threshold voltage of the E, P1, P2 and P3 states are expanded from the distribution range indicated by the solid line to the distribution range indicated by the dotted line. However, the expansion degree may be reduced as compared with the expansion degree (distribution range indicated by the dotted line in the graph (d) of FIG. 4) caused by the coupling upon the E-P1 program. Therefore, the expansion degree caused to the adjacent word line WLi+1 by the coupling upon the PreP1-P1 program of the word line WLi may be reduced as compared with the expansion degree caused to the adjacent word line WLi+1 by the coupling upon the E-P1 program of the word line WLi.

Figure 7:
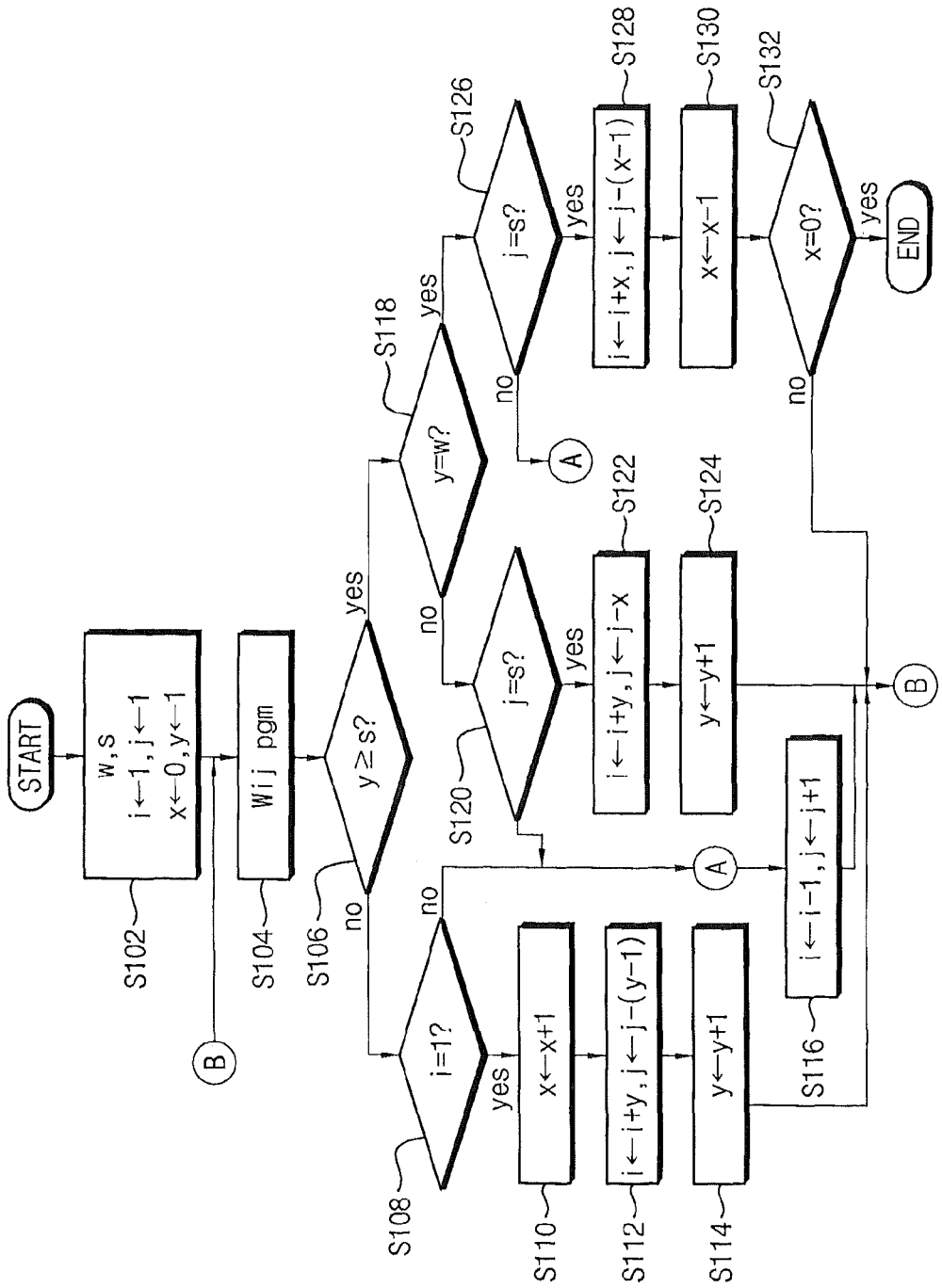
FIG. 7 is a flowchart illustrating a programming method according to example embodiments.

FIG. 7 is a flowchart illustrating a programming method according to example embodiments.

Referring to FIG. 7, the control circuit initializes the system (S102 i←1, j←1, y←1, x←0). In step S102, values of a write word line number w, a program step number s, a write word line parameter i, a program step parameter j, a program step counter x, and a word line counter y are initialized. The primary program of Wij (Wij pgm) (that is, the first word line) is performed based on the initialized values (S104). Then, it is checked whether the value of the word line counter y is equal to or greater than the value of the set program step s (S106 y>s?). In step S106, if the y value is smaller than the s value, it is checked whether the value of the word line parameter i is "1" (S108 i=1?). If the value of the word line parameter i is "1", the value of the program step counter x is increased by 1 (S110 x←x+1) and the values of the word line parameter i and the program step parameter j are changed to perform the primary program of the next word line (S112 i+y, j←j−(y−1)). In addition, the value of the word line counter y is increased by 1 (S114 y←y+1). Then, the process returns to step S104 to perform the primary program of the next word line based on the changed word line parameter and the program step parameter. In the loop repeating steps S104 to S114, the program operation of the first word line is performed and then the program operation is performed with respect to other adjacent word lines. As the loop repeats, the number of the word line subject to the program operation next to the first word line may be increased 1 by 1 and the program order is reduced 1 by 1.

If the value of the word line parameter i is not "1" in step S108, the values of the parameters i and j are changed for the next-order program operation of the previous word lines (S116 if i−1, j←j+1) and the process returns to step S104. In the loop repeating steps S104-S106-S108-S116, the process to find the first word line is performed while performing the next-order program of the previous word line at the word line subject to the program operation next to the first word line. Therefore, the word line parameter is reduced 1 by 1 and the program order is increased 1 by 1.

In step S106, if the value of word line counter y is equal to the number of program steps s, it is checked whether the value of the word line counter y is equal to the number of the write word lines w (S118 y=w?). In step 118, if the value of the word line counter y is not equal to the number of the write word lines w, it is checked whether the program parameter j is equal to the number of program steps s (S120 j=s?). In step 120, if the program parameter j is equal to the number of program steps s, it is determined that the program steps of the corresponding word line have been completed so that the parameters i and j are changed for the primary program of the word line spaced by the number of program steps s. That is, the parameter i is increased by the value of the word line counter y and the parameter j is reduced by the value of the program step counter x (S122 i←i+y, j←j−x). Then, the value of the word line counter y is increased by 1 (S124) and the process returns to step S104. If "j≠s" in step S120, step S116 is performed for the next program step of the previous word lines.

In step S118, if the value of the word line counter y is equal to the number of predetermined word lines w, it is checked whether the parameter j is equal to the number of the program steps s (S126 j=s?). In step 126, if the program parameter j is equal to the number of program steps s, it is determined that the program steps of the corresponding word line have been completed so that the parameters i and j are changed for the next program step of the final word line (S128 i←i+x, j←j−(x−1)). In step S128, the parameter i is increased by the value of the program step counter x and the parameter j is reduced by x−1. In addition, the value of the program step counter x is reduced by 1 (S130 x←x−1). Then, it is checked whether the x value reduced by 1 is "0" (S132 x=0?). If the x value is "0", the process ends and if the x value is not "0", the process returns to step S104 (Via Ⓑ). If "j≠s" in step S126, step S116 is performed (Via Ⓐ).

Figure 8:
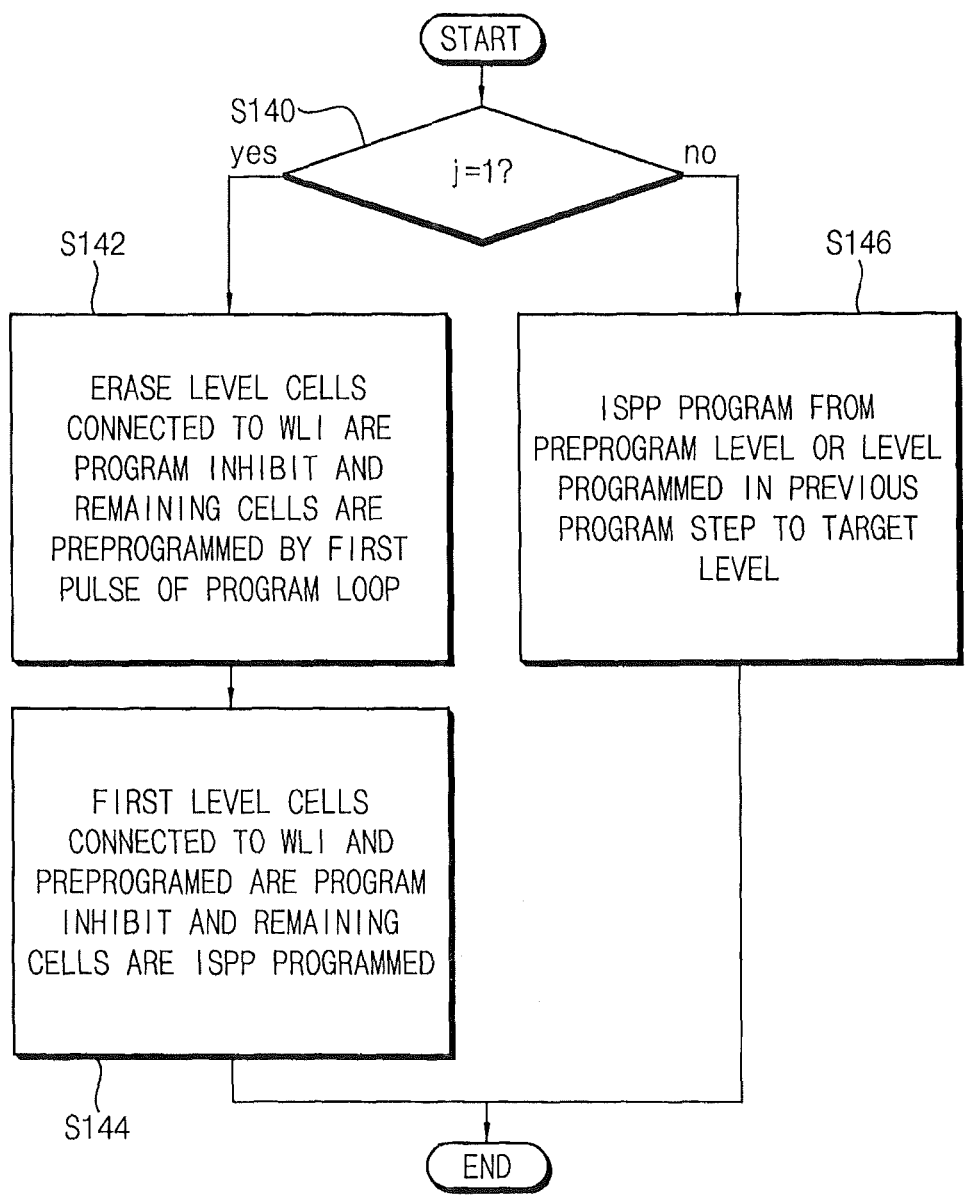
FIG. 8 is a flowchart illustrating a subprogram in FIG. 7 according to example embodiments.
Figure 9:
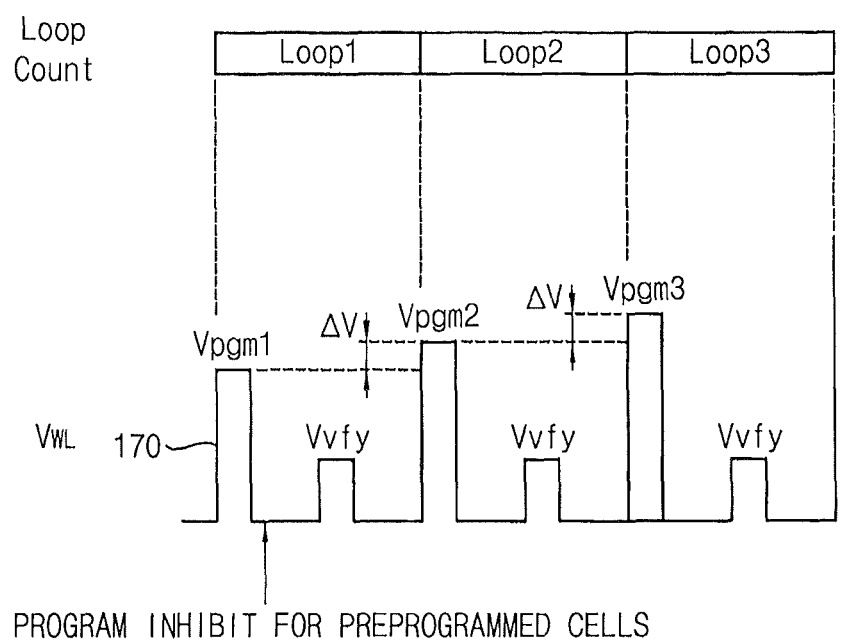
FIG. 9 is a diagram for describing a use of a program pulse of a first program loop of a primary program as a preprogram pulse as an example of the subprogram of FIG. 8.

FIG. 8 is a flowchart illustrating a subprogram (S104) in FIG. 7 according to example embodiments, and FIG. 9 is a diagram for describing a use of a program pulse of a first program loop of a primary program as a preprogram pulse as an example of the subprogram of FIG. 8.

Referring to FIGS. 8 and 9, the control circuit determines whether the present step is the primary program step (S140 j=i?). If the present step is the primary program step, erase level cells connected to the word line are subject to the program inhibit state and remaining cells are preprogrammed (Vpgm1, Vpgm2, Vpgm3) (Vvfy) by the first program pulse (Vpgm1) (see, 170 of FIG. 9) of the program loop (S142 Loop1, Loop2, Loop3) followed by a read verify operation Vvfy. Then, the preprogrammed first level cells are subject to the program inhibit state and the remaining cells are programmed through the ISPP scheme (S144). In step S140, if the present step is not the primary program step, the cells are programmed from the preprogrammed level or the level programmed in the previous program step to the target level through the ISPP scheme (S146) using Vpgm2 in Loop2 and Vpgm3 in Loop3.

Figure 10:
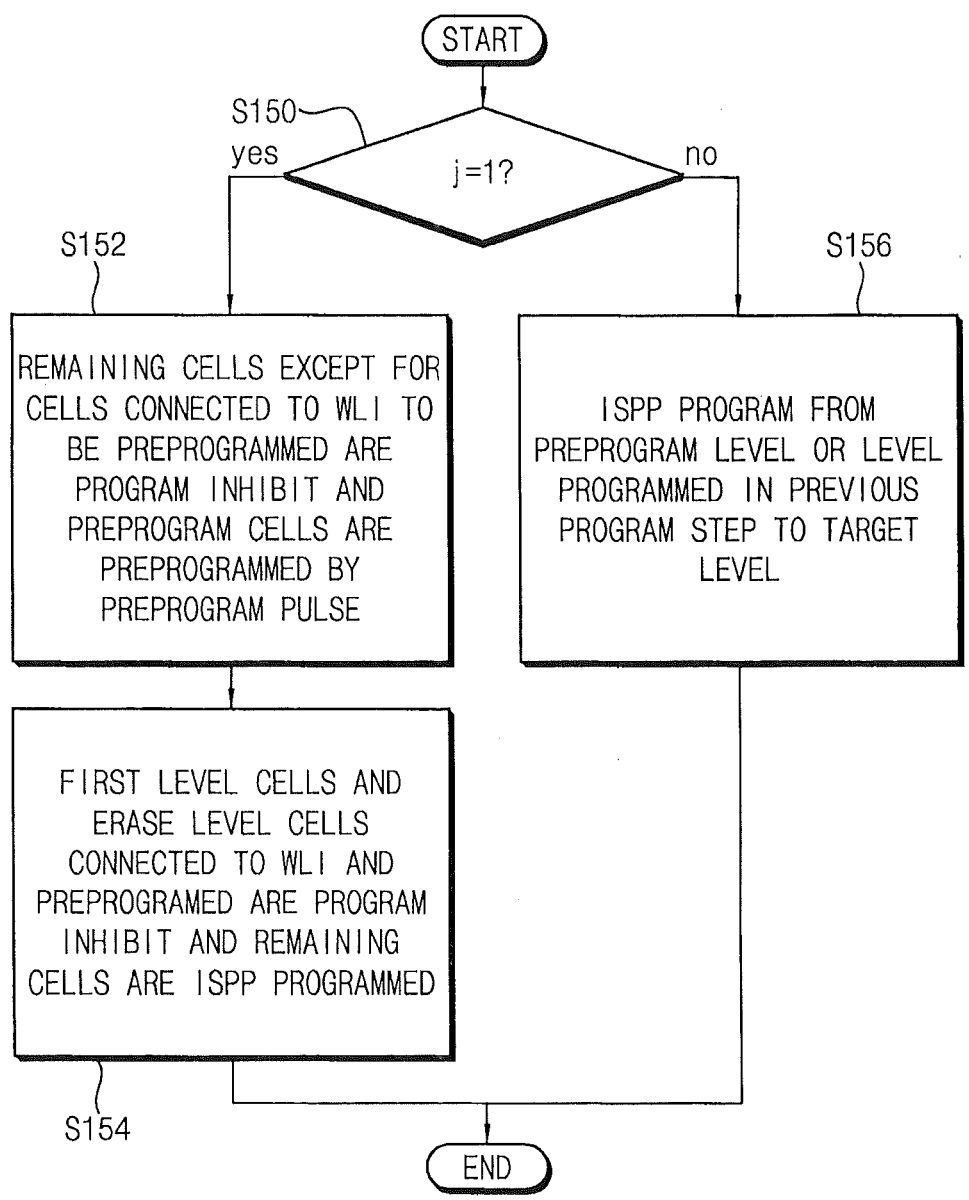
FIG. 10 is a flowchart illustrating a subprogram in FIG. 7 according to another example embodiment.
Figure 11:
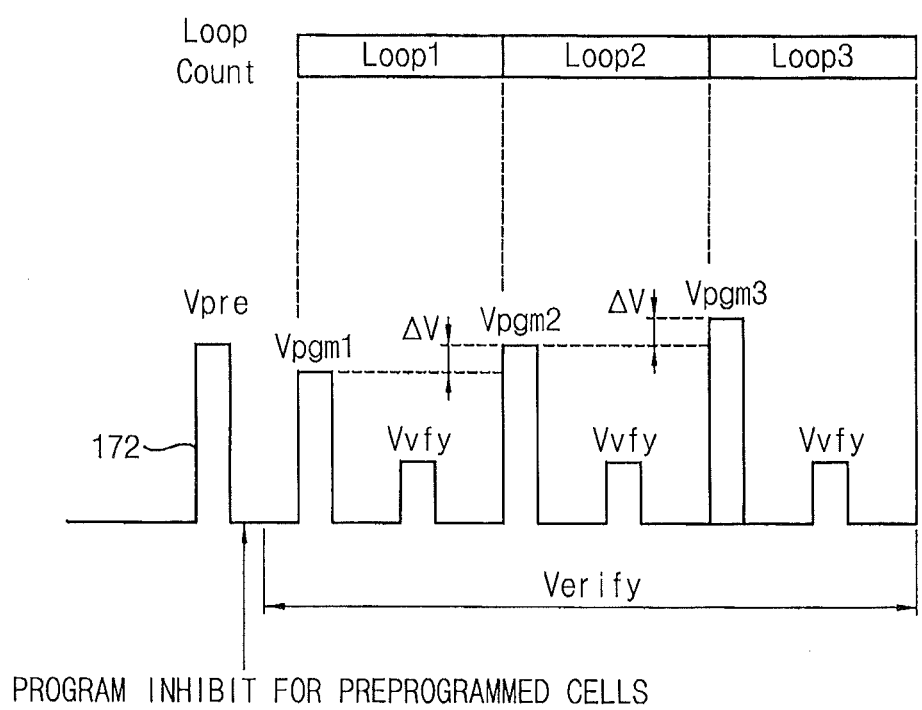
FIG. 11 is a diagram for describing a preprogram pulse added before a program pulse of a first program loop of a primary program as another example of the subprogram of FIG. 7.

FIG. 10 is a flowchart illustrating a subprogram (S104) in FIG. 7 according to another example embodiment, and FIG. 11 is a diagram for describing a preprogram pulse Vpre added before a program pulse (Vpgm1, Vpgm2, Vpgm3) (Vvfy) of a first program loop (Loop1, Loop2, Loop3) of a primary program as another example of the subprogram of FIG. 7. The example embodiment shown in FIG. 10 is different from the example embodiment described above in that the preprogram pulse is added to the program signal.

Referring to FIG. 10, the control circuit determines whether the present step is the primary program step (S150 j=1?). If the present step is the primary program step, the remaining cells except for the cells connected to the word line and to be programmed are subject to the program inhibit state and the remaining cells are preprogrammed by the program pulse (see, 172 of FIG. 9) added just before the normal program loop (S152). Then, the preprogrammed first level cells and the erase level cells are subject to the program inhibit state and the remaining cells are programmed through the ISPP scheme (S154). In step S150, if the present step is not the primary program step, the cells are programmed from the preprogrammed level or the level programmed in the previous program step to the target level through the ISPP scheme (S156).

The above example embodiment and another example embodiment adopt the program pulse application scheme, so the distribution range of the threshold voltage of the preprogrammed cells may follow the one shot distribution profile.

Figure 12:
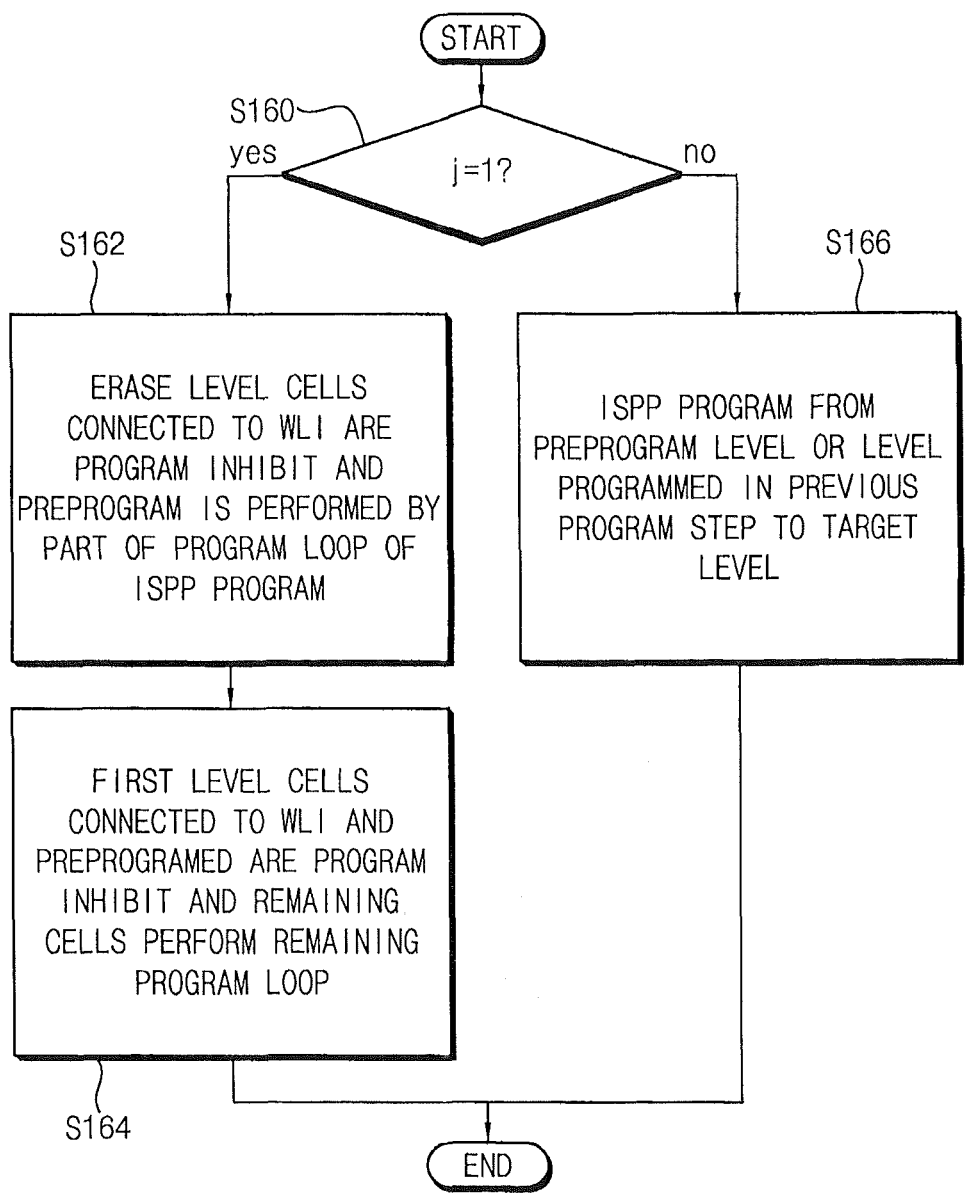
FIG. 12 is a flowchart illustrating a subprogram in FIG. 7 according to still another example embodiment.
Figure 13:
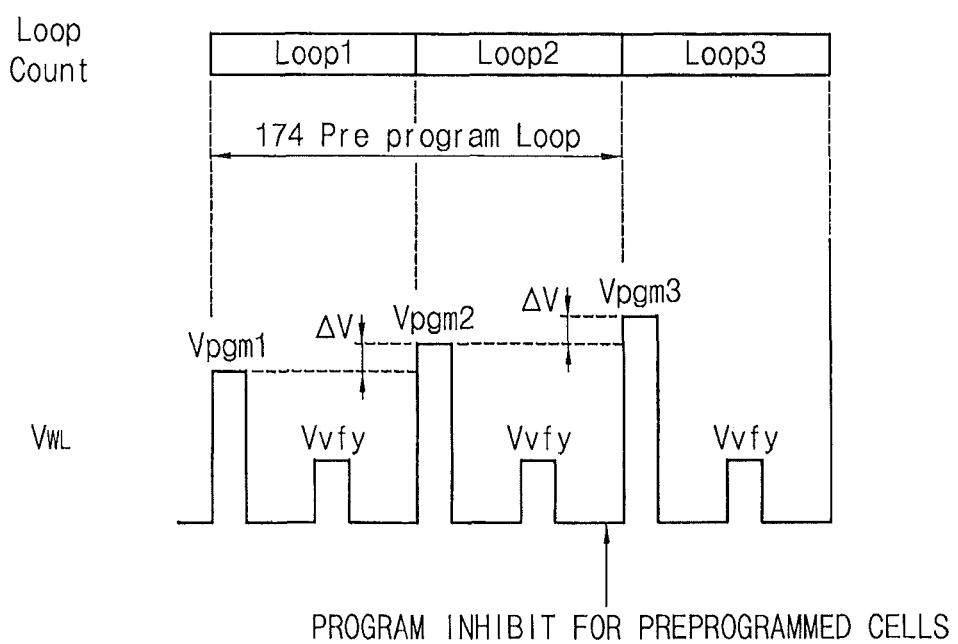
FIG. 13 is a diagram for describing a use of one or more program loops of a primary normal program as a preprogram loop.

FIG. 12 is a flowchart illustrating a subprogram (S104) in FIG. 7 according to still another example embodiment, and FIG. 13 is a diagram for describing a use of one or more program loops of a primary normal program as a preprogram loop. The example embodiment shown in FIG. 12 is different from the example embodiment described above in that the preprogram is performed through the loop scheme other than the pulse scheme. As compared with the preprogram pulse scheme, the preprogram loop scheme can reduce variation range of the threshold voltage so that the influence of the word line coupling can be reduced.

Referring to FIGS. 12 and 13, the control circuit determines whether the present step is the primary program step (S160 j=1?). If the present step is the primary program step, the erase level cells connected to the word line are subject to the program inhibit state and the remaining cells are preprogrammed (Vpgm1, Vpgm2, Vpgm3) (Vvfy) by the first program loop (see, 174 of FIG. 13) of the ISPP program (S162) (Loop1, Loop2, Loop3). Then, the cells are programmed by the first program pulse of the first loop and the preprogram state is verified by the first verify pulse. The cells, which are preprogrammed more than the verify level, are subject to the program inhibit state and the cells, which are preprogrammed lower than the verify level, are programmed to the preprogram level by the program pulse of the second loop. In the same manner, if the cells are preprogrammed to the target level by the second verify pulse, the preprogrammed cells are subject to the program inhibit and the remaining level cells are subject to the program operation and the verify loop (S164) until the cells have the target level. In step S160, if the present step is not the primary program step, the cells are programmed from the preprogrammed level or the level programmed in the previous program step to the target level through the ISPP scheme (S166).

Figure 14:
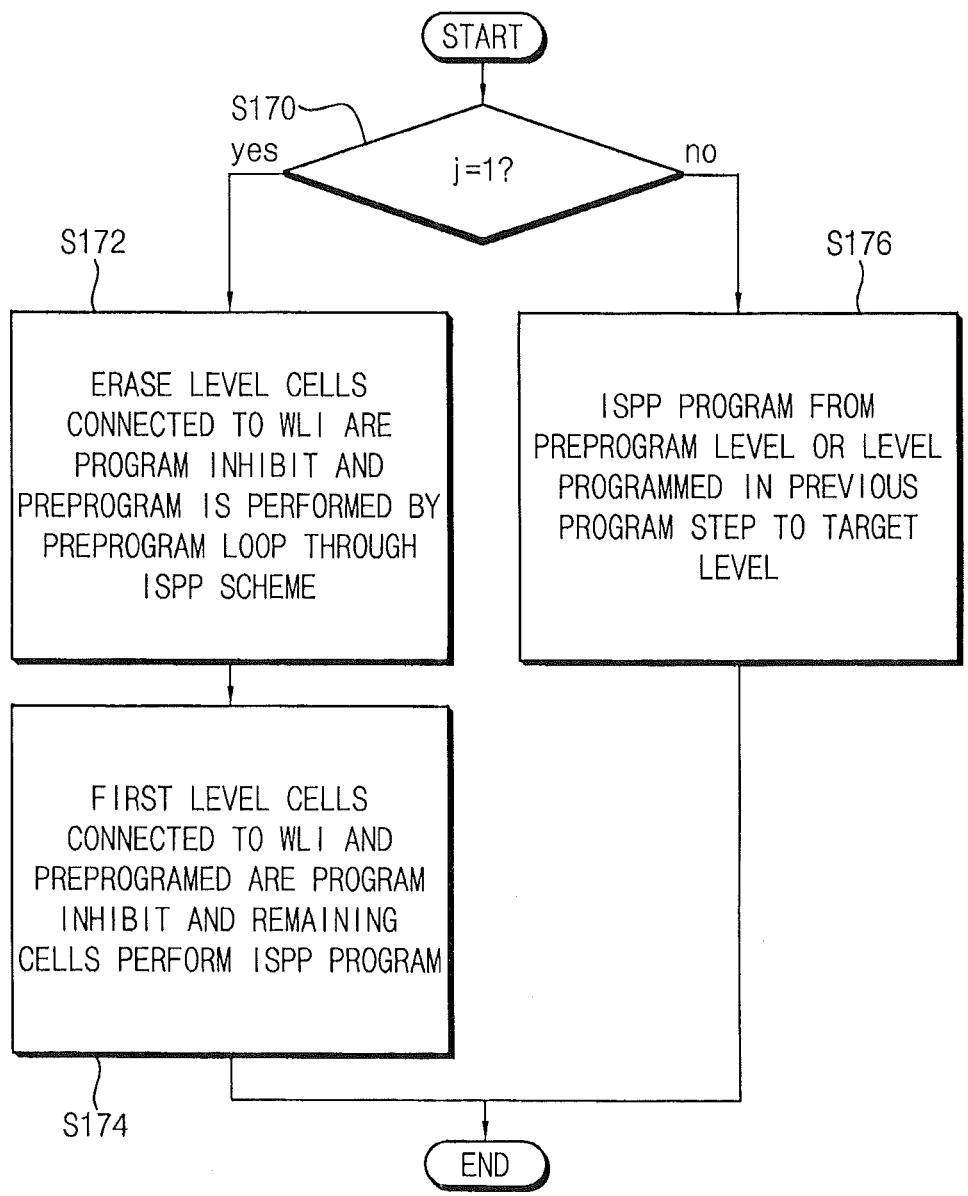
FIG. 14 is a flowchart illustrating a subprogram in FIG. 7 according to still another example embodiment.
Figure 15:
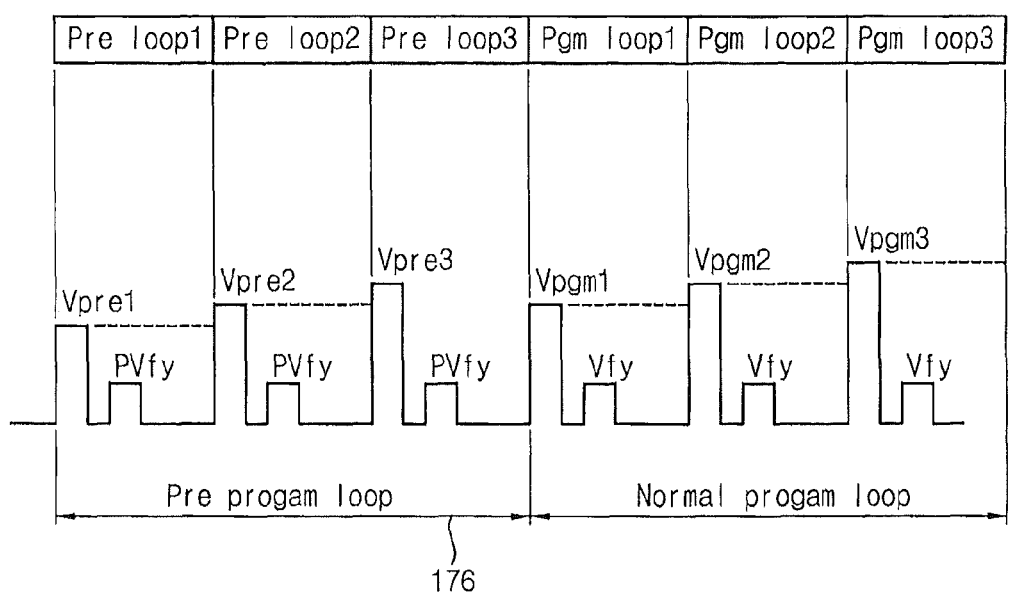
FIG. 15 is a diagram for describing a preprogram loop added before a first program loop of a primary program as an example of the subprogram of FIG. 14.

FIG. 14 is a flowchart illustrating a subprogram (S104) in FIG. 7 according to still another example embodiment, and FIG. 15 is a diagram for describing a preprogram loop added before a first program loop of a primary program as an example of the subprogram of FIG. 14. The example embodiment shown in FIG. 14 is different from the preprogram loop scheme described above in that the preprogram loop is added just before the normal program loop without using both of the normal program loop and the preprogram loop.

Referring to FIGS. 14 and 15, the control circuit determines whether the present step is the primary program step (S170 j=1?). If the present step is the primary program step, the erase level cells connected to the word line are subject to the program inhibit state and the remaining cells are preprogrammed by the preprogram loop (see, 176 of FIG. 15) (S172). Then, the cells are programmed by the preprogram pulse (Vpre1, Vpre2, Vpre3)(PVfy) of each preprogram loop and the preprogram state is verified by the verify pulse (Vvfy). The cells, which are preprogrammed more than the verify level, are subject to the program inhibit state and the cells, which are preprogrammed lower than the verify level, are programmed to the preprogram level by the preprogram pulse of the second loop (Loop2, Loop3). In the same manner, if the cells are preprogrammed to the target level by the second verify pulse, the preprogram is performed through the ISPP scheme in which the preprogrammed cells are subject to the program inhibit. The, as the preprogram has been completed, the remaining level cells are programmed to have the target level through the ISPP scheme (S174). In step S170, if the present step is not the primary program step, the cells are programmed from the preprogrammed level or the level programmed in the previous program step to the target level through the ISPP scheme (S176).

Figure 16:
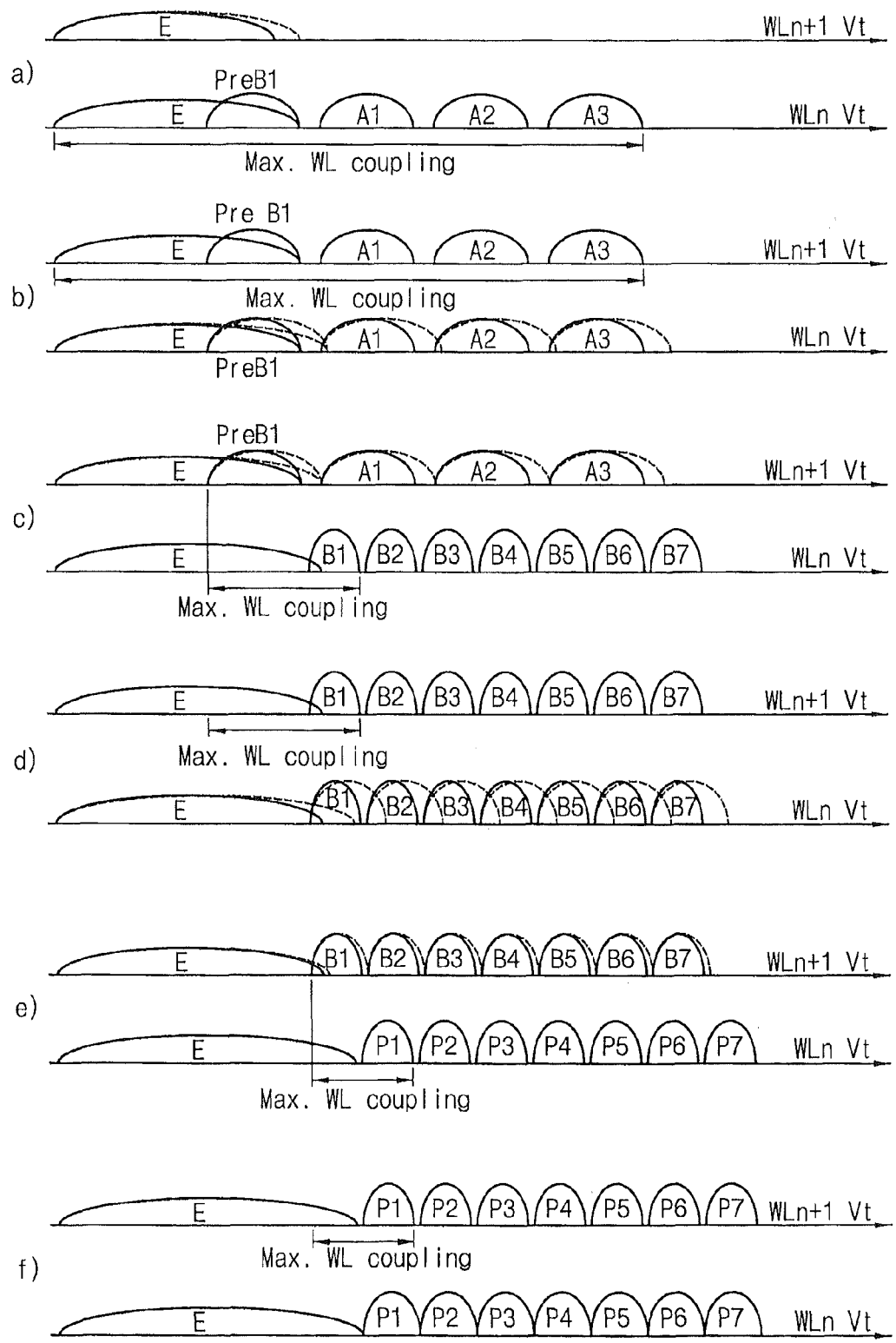
FIG. 16 is a diagram illustrating the distribution range of threshold voltages in respective program steps for describing the multi-step program operation employing a preprogram loop scheme according to example embodiments.
Figure 17:
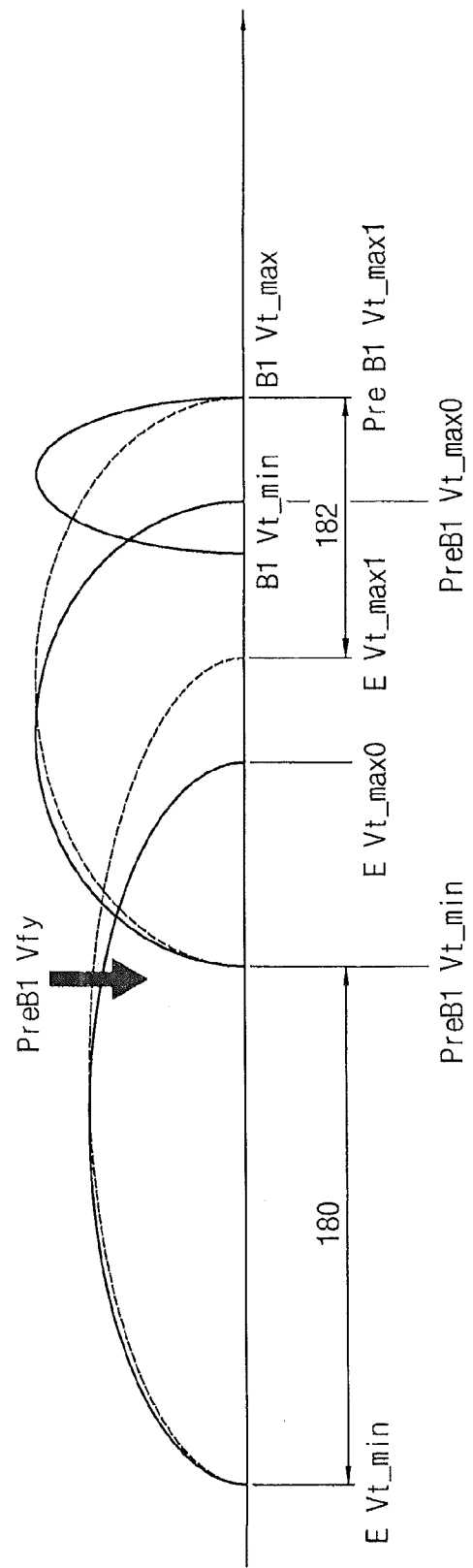
FIG. 17 is a diagram illustrating the distribution range of threshold voltage in a loop-preprogrammed state according to example embodiments.

FIG. 16 is a diagram illustrating the distribution range of threshold voltage in respective program steps for describing the multi-step program operation employing a preprogram loop scheme according to example embodiments. FIG. 17 is a diagram illustrating the distribution range of threshold voltage in a loop-preprogrammed state according to example embodiments. FIG. 16 illustrates the 3-bit program scheme and the program is implemented by the 3 program steps Referring to FIGS. 16 and 17, as shown in a graph (a), the cells connected to the word line WLn are primarily programmed from the E state to the Pre B1 state and the A1, A2 and A3 (Max. WL coupling) states through the ISPP scheme. At this time, as shown in FIG. 17, the distribution range of the threshold voltage Vt of the Pre B1 state is at least larger than a word line coupling gain 180 and is set to the extent which is obtained by subtracting a word line coupling limit margin width 182 from the maximum value of the final target level. The word line coupling gain 180 is (Pre B1 Vt_min)–(E Vt_min) and the word line coupling limit margin width 164 is calculated by adding the value, which is obtained by subtracting the preprogram level variation from the erase level variation, to the value of (Pre B1 Vt_max1)–(E Vt_max1). Pre B1 Vt_max0 is the maximum threshold voltage in the programmed state and Pre B1 Vt_max1 is the maximum threshold voltage caused by the word line coupling. Thus, the preprogram loop is performed in multi-steps until the minimum value Pre B1 Vt_min of the Pre B1 state is equal to or higher than the preprogram verify level Pre B1 Vfy.

Therefore, the E state of the cells coupled to the word line WLn+1 is expanded from the distribution range indicated by the solid line (B1 Vt_min, B1 Vt_max)(E Vt_min, E Vt_max) to the distribution range indicated by the dotted line due to the word line coupling (E Vt_max1, B1 Vt_max). Then, as shown in a graph (b), if the cells coupled to the word line WLn+1 are primarily programmed, the distribution range of the threshold voltage is shifted from the E state to the Pre B1 state and the A1, A2 and A3 states. Thus, the E state, the Pre B1 state and the A1, A2 and A3 states of the cells coupled to the word line WLn are expanded from the distribution range indicated by the solid line to the distribution range indicated by the dotted line due to the word line coupling. As shown in a graph (c), the threshold voltage of the cells coupled to the word line WLn are shifted from the Pre B1 state to the B1 state and from the A1, A2 and A3 states to the (B2, B3), (B4, B5) and (B6, B7) states through the secondary program step. Therefore, the maximum variation of the threshold voltage, that is, the maximum variation of the threshold voltage from the preprogram state to the B1 state may be reduced. Thus, the influence of the word line coupling can be reduced so that the E state and the Pre B1, A01, A1, A2 and A3 states of the cells coupled to the word line WLn+1 can be expanded from the distribution range indicated by the solid line to the distribution range indicated by the dotted line, but the expansion degree is reduced. Then, as shown in a graph (d), if the cells coupled to the word line WLn+1 are secondarily programmed, the distribution range of the threshold voltage is shifted from the Pre B1 and A1, A2 and A3 states to the B1, (B2, B3), (B4, B5) and (B6, B7) states. Thus, the maximum variation of the threshold voltage is reduced so that the influence caused by the word line coupling may be reduced. Then, as shown in a graph (e), the cells coupled to the word line WLn are tertiary-programmed so that the distribution range of the threshold voltage is shifted from the B1-B7 states to the P1-P7 states. In the same manner, as shown in a graph (f), the cells coupled to the word line WLn+1 are tertiary-programmed so that the distribution range of the threshold voltage is shifted from the B1-B7 states to the P1-P7 states.

Therefore, the influence of the word line coupling can be reduced corresponding to the reduction of the maximum variation of the threshold voltage through the preprogram loop of the ISPP scheme.

According to the pulse preprogram scheme, although the addition of preprogram time to the existing program time is small, the coupling reduction effect is small because the word line coupling gain is small. In contrast, according to the loop preprogram scheme, the program time is added to the existing normal program time corresponding to the number of the preprogram loops, so the total program time is increased, but the word line coupling effect can be remarkably reduced.

Figure 18:
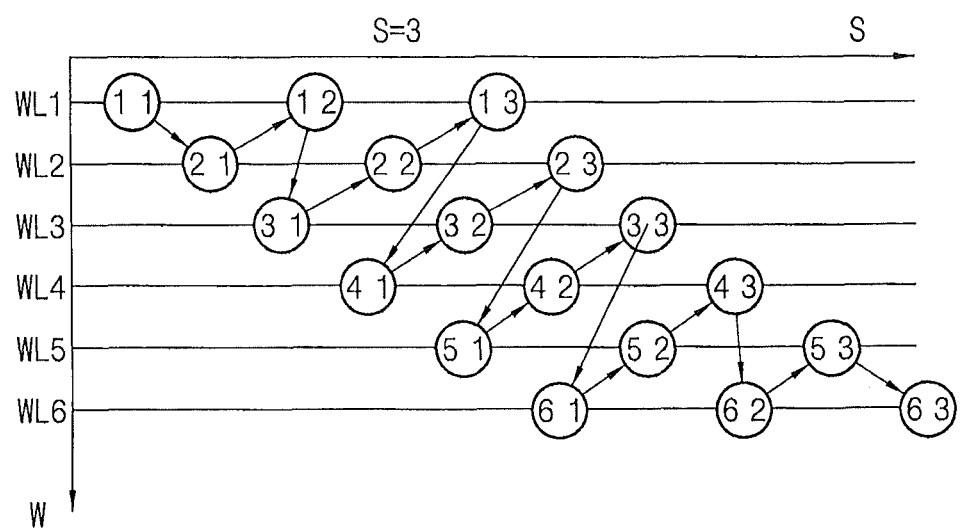
FIG. 18 is a diagram illustrating a program sequence according to example embodiments.
Figure 19:
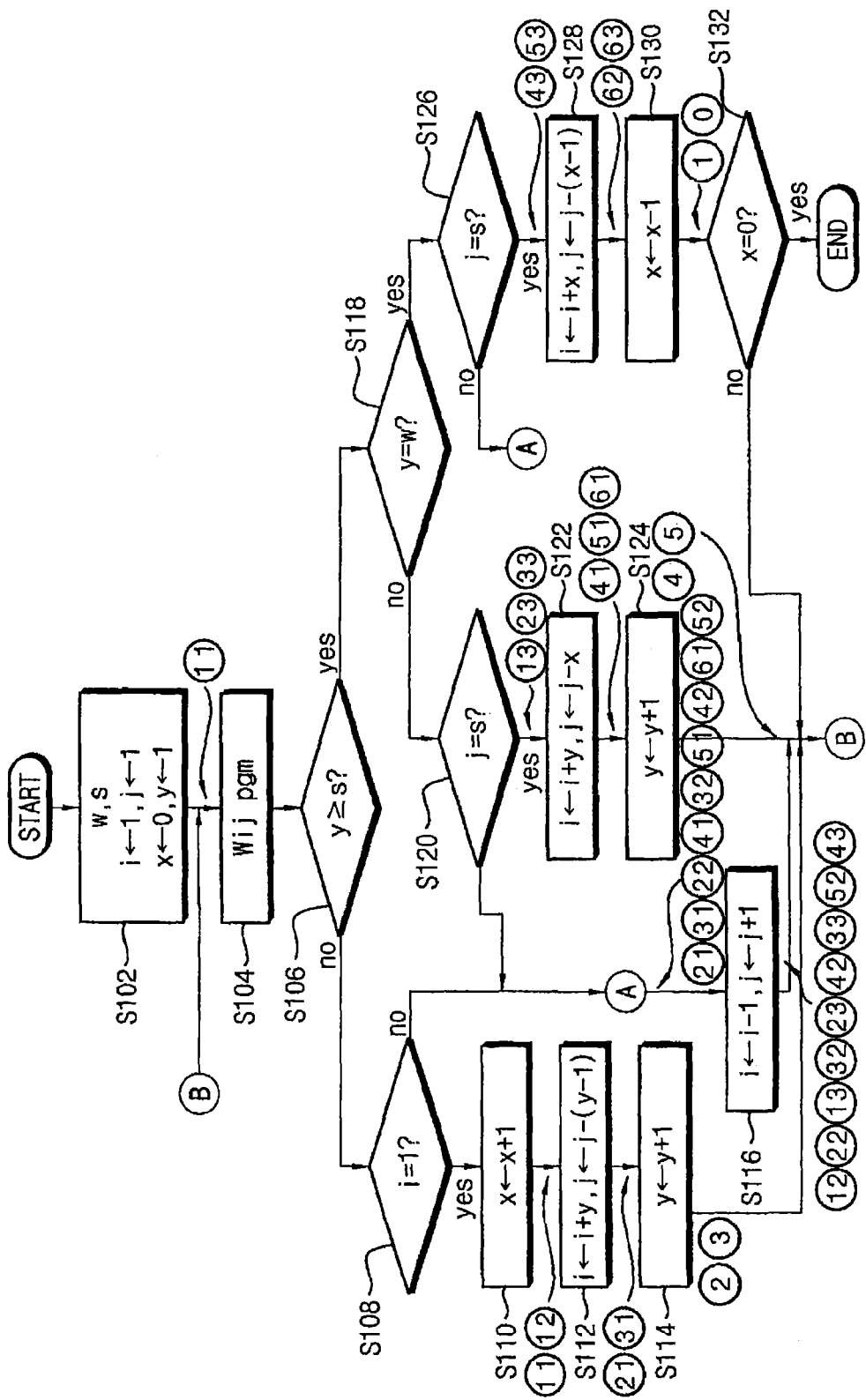
FIG. 19 is a flowchart illustrating a programming method corresponding to the program sequence of FIG. 18.

FIG. 18 is a diagram illustrating a program sequence according to example embodiments, and FIG. 19 is a flowchart illustrating a programming method corresponding to the program sequence of FIG. 18.

FIG. 18 shows the sequence of programming 3-bit data to the word lines through the 3-step multi-program (S=3). The primary program of each word line performs the preprogram of the example embodiment. The secondary program of each word line is programmed from the level preprogrammed in the primary program to the target level. Thus, the program sequence is determined such that the primary preprogram of the adjacent word line WLn+1 can be performed between the primary preprogram and the secondary preprogram of the present word line WLn.

Referring to FIGS. 18 and 19, the control circuit initializes the system (S102 i←1, j←1, y←1, x←0). In step S102, values of a write word line number w, a program step number s, a write word line parameter i, a program step parameter j, a program step counter x, and a word line counter y are initialized and the cells of the first word line WL1 are primarily programmed (ij=(11)) and the cells of the second word line WL2 are primarily programmed (ij=(21)) in step S104 through steps S106-S108-S110 (x←x+1)-S112 (i←i+y, j←j–(y–1))-S114 (y←y+1) (hereinafter, referred to as "loop ①"). Then, the cells of the first word line WL1 are programmed from the preprogram level or the primary target level to the second target level in step S104 (ij=(12)) through steps S106 (y≥s?)-S108 (i=1?)-S116 (hereinafter, referred to as "loop ②"). After the secondary program has been performed, the loop ① is performed with respect to the first word line WL1 to skip to the next word line. Thus, the third word line WL3 is primarily programmed (ij=(31)). In addition, the value of the word line counter y is 3, steps S106-S118-S120 (j=s?)-S116 (hereinafter, referred to as "loop ③") are repeatedly performed (Via (B)) for the secondary program of the second word line (ij=(22)) and the tertiary program of the first word line (ij=(13)). If the tertiary program of the first word line is completed, the program of the first word line is completed. In step 120, since j has the value of 3 (s=3), which is the same as the value of s, the primary program of the fourth word line WL4 is performed (ij=(41)) through steps S122 (j←j–x)-S124 (y←y+1) (hereinafter, referred to as "loop ④").

The program is performed through the loops ③ and ④ until ij=((32)–(23)–(51)–(42)–(33)–(61)) is achieved. If the value of the word line counter y becomes 6, the program is performed through steps S118 (y=w?)-S126-S116 (i←i–1) (hereinafter, referred to as "loop 5") until ij=(52)–(43)) is achieved. In step 126, a value of j in ij=(43) is "3", the secondary and tertiary programs of the final word line WL6 are performed (ij=(62)–(53)–(63)) through steps S128 (i←i+x)(j←j–(x–1))-S130 (x←x–1)-S132 otherwise step 116 is performed Via (A). In step S130, the value of the program step counter x is reduced 1 by 1 and the program ends when x=0 in step S132 (x–0?).

Figure 20:
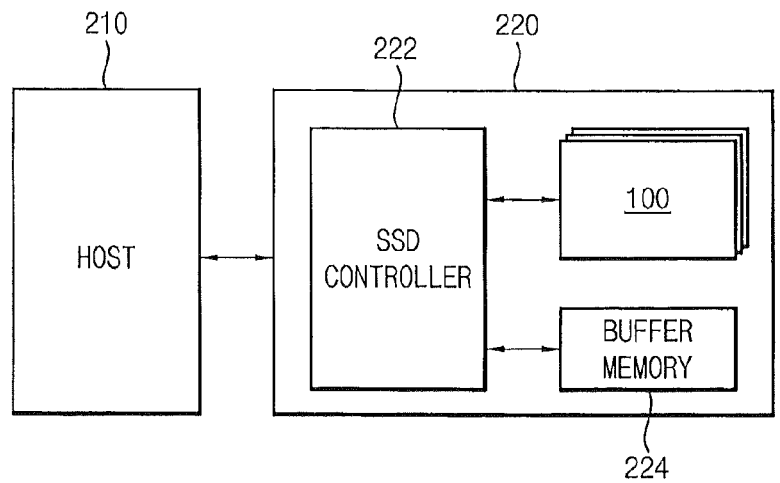
FIG. 20 is a block diagram illustrating a structure of a Solid State Disk (SSD) system including a flash memory device according to example embodiments.

FIG. 20 is a block diagram illustrating a structure of a Solid State Disk (SSD) system including a flash memory device according to example embodiments.

Referring to FIG. 20, the SSD system 200 may include a host 210 and an SSD 220. The SSD 220 may include an SSD controller 222, a buffer memory 224, and the flash the memory device 100. The SSD controller 222 physically connects the host 210 to the SSD 220. That is, the SSD controller 222 may provide an interface to the SSD 222 according to the bus format of the host 210. The SSD controller 222 may decode the instructions provided from the host 210. The SSD controller 222 may access the flash memory device 100 according to the decoding result. The bus format of the host 210 may include a USB (Universal Serial Bus), an SCSI (Small Computer System Interface), a PCI express, an ATA, a PATA (Parallel ATA), or an SAS (Serial Attached SCSI). The buffer memory 224 may a synchronous DRAM to provide the sufficient buffering in the SSD 220. However, the buffer memory 224 is not limited to a specific memory, but may be variously modified. The buffer memory 224 may temporally store write data supplied from the host 210 or the data read from the flash memory device 100. Upon the read request of the host 210, if the data existing in the flash memory device 100 are stored in the buffer memory 224, the buffer memory 224 may support the cache function to directly supply the stored data to the host 210. In general, the data transmission rate by the bus format (for example, SATA or SAS) of the host 210 can be higher than the data transmission rate of the memory channel of the SSD 220. If the interface speed of the host 210 is high, a large-storage buffer memory 224 can be provided to diminish the performance degradation caused by the speed difference.

The flash memory device 100 may be used as a main memory of the SSD 220. To this end, the flash memory device 100 may be prepared as an NAND type flash memory having a large-storage capacity. However, the type of the flash memory device 100 provided in the SSD 220 may not be limited to the NAND type flash memory. For example, a NOR type flash memory, a hybrid flash memory including at least two types of memory cells, or a one-NAND flash memory, in which a controller is accommodated in a memory chip, can be used as the flash memory device 100.

Although the NAND flash memory is explained as an example of the main memory, other nonvolatile memory devices may be used as the main memory. For example, at least one of the nonvolatile memory devices, such as PRAM, MRAM, ReRAM and FRAM, and volatile memory devices, such as DRAM and SRAM, may be used as the main memory.

The flash memory device 100 shown in FIG. 20 may be substantially identical to the flash memory device shown in FIG. 1. In addition, the preprogram operation may be performed in the flash memory device 100 shown in FIG. 20 to minimize the influence of word line coupling when the multi-step program operation of the multi-level cell (MLC) is performed.

Figure 21:
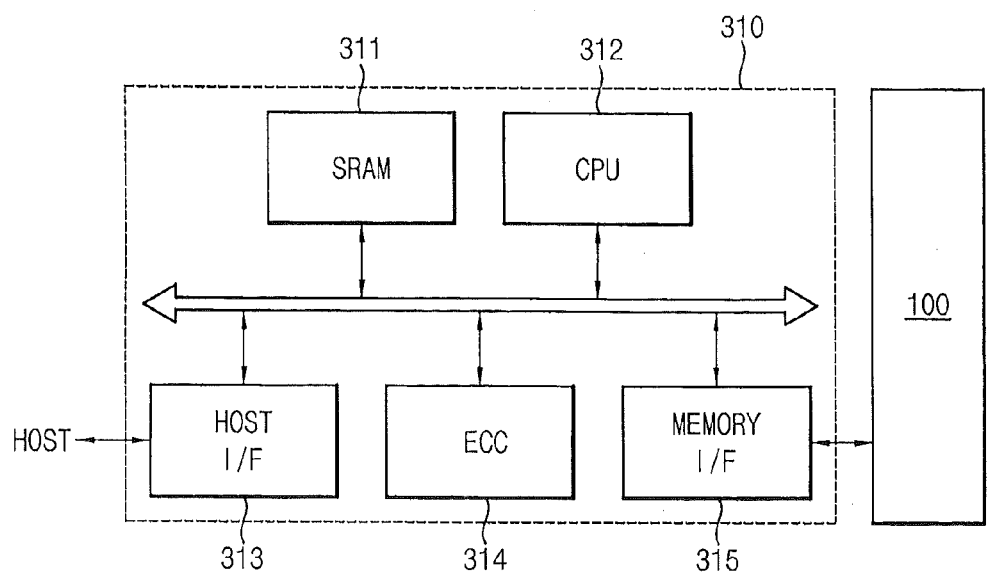
FIG. 21 is a block diagram illustrating a structure of a memory system according to example embodiments.

FIG. 21 is a block diagram illustrating a structure of a memory system according to example embodiments.

Referring to FIG. 21, the memory system 300 according to example embodiments may include a flash memory device 100 and a memory controller 310. The flash memory device 100 shown in FIG. 21 may be substantially identical to the flash memory device shown in FIG. 1. In addition, the pre-program operation may be performed in the flash memory device 100 shown in FIG. 21 to minimize the influence of word line coupling when the multi-step program operation of the multi-level cell (MLC) is performed.

The memory controller 310 controls the flash memory device 100. The flash memory device 100 may be combined with the memory controller 310 to provide a memory card or an SSD (solid state disk). An SRAM 311 may be used as a working memory of a CPU 312. A host interface 313 may include a data exchange protocol of the host connected to the memory system 300. An error correction block 314 can detect and correct the error included in the data read from the flash memory device 100. A memory interface 315 has the interface function with the flash memory device 100 according to the example embodiment. The CPU 312 can perform the control operation for data exchange of the memory controller 310. The memory system 300 according to the example embodiment may be provided with a ROM to store code data for interfacing with the host.

The flash memory device 100 may be provided in the form of a multi-chip package including a plurality of flash memory chips. The memory system 300 according to the example embodiment may be used as a storage medium having a low error rate with a high reliability. In particular, the flash memory device according to the example embodiment can be provided in the memory system, such as the solid state disk. In this case, the memory controller 310 can make communication with external devices (for example, host) through one of various interface protocols, such as USB, MMC, PCI-E, SAS, SATA, PATA, SCSI, ESDI and IDE. In addition, the memory controller 310 may be provided with a component to perform the random operation.

Figure 22:
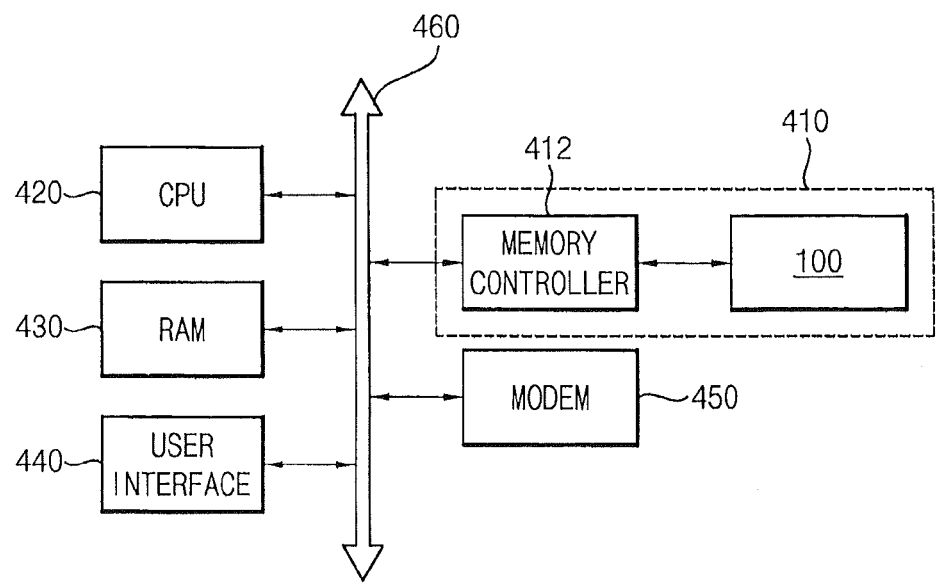
FIG. 22 is a block diagram illustrating a structure of a computing system including a flash memory device according to example embodiments.

FIG. 22 is a block diagram illustrating a structure of a computing system including a flash memory device according to example embodiments.

Referring to FIG. 22, the computing system 400 according to the example embodiment may include a CPU 420 electrically connected to a system bus 460, a user interface 440, a modem 450, such as a baseband chipset a RAM 430, and a memory system 410. The memory system 410 may include a memory controller 412 and a flash memory device 100. The memory controller 410 physically connects the CPU 420 to the flash memory device 100 through the system bus 460. That is, the memory controller 412 provides the interface function with respect to the flash memory device 100 in correspondence with the bus 460. The flash memory device 100 shown in FIG. 22 may be substantially identical to the flash memory device shown in FIG. 1. In addition, the pre-program operation may be performed in the flash memory device 100 shown in FIG. 22 to minimize the influence of word line coupling when the multi-step program operation of the multi-level cell (MLC) is performed.

If the computing system 400 according to the example embodiment is a mobile device, a battery may be additionally provided to supply operating voltage of the computing system 400. The computing system 400 according to the example embodiment may be further provided with an application chipset, a camera image processor and a mobile DRAM. For example, the memory system 410 may constitute the SSD using a nonvolatile memory to store data. For example, the memory system 410 shown in FIG. 22 may constitute the SSD 200 shown in FIG. 20. In this case, the memory controller 412 may operate as the SSD controller.

Figure 23:
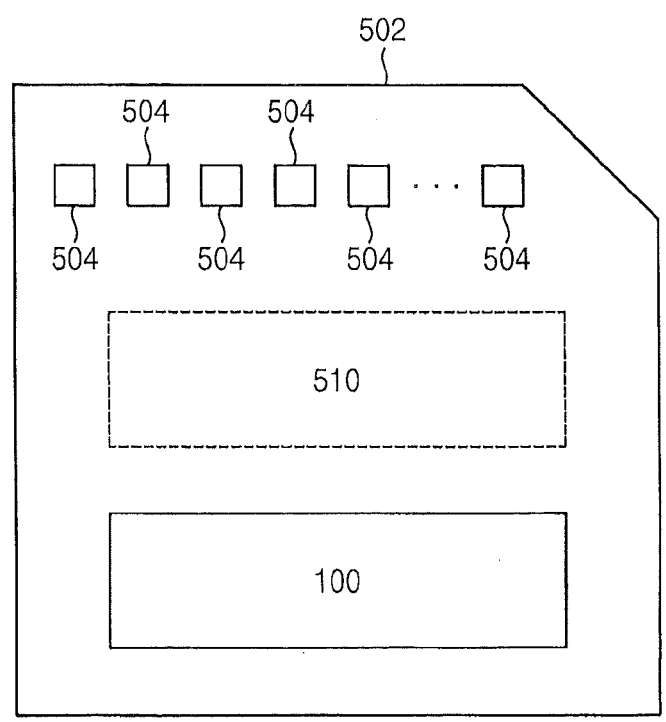
FIG. 23 is a block diagram illustrating a memory module including at least one memory device according to example embodiments.

FIG. 23 is a block diagram illustrating a memory module 500 including at least one memory device according to example embodiments.

Although the memory module 500 is illustrated as a memory card, the concept of the memory module 500 can be applied to other mobile memories or portable memories (for example, USB flash drive) within the scope of the "memory module" according to the example embodiment.

In some example embodiments, the memory module 500 may include a housing 502 to accommodate at least one flash memory device 100, but the housing 502 may not be essentially required for all devices or device applications. At least one flash memory device 100 may include an array of multi-level memory cells which are preprogrammed upon the multi-step program operation according to the example embodiments. If the housing 502 is provided, the housing 502 may include at least one contact 504 to communicate with a host device. The host device may include a smart phone, a digital camera, a digital recorder/player, a PDA, a personal computer, a memory card reader, an interface hub, a navigation device, and an MP3 player. In some example embodiments, the contact 504 is configured as part of a standard interface. For example, in the USB flash drive, the contact 504 is configured as a USB type-A connector. In some example embodiments, the contact 504 is configured as an interface available from a CompactFlash™ memory card licensed by Sandisk Corporation, a Memory Stick™ memory card licensed by Sony Corporation, and an SD Secure Digital™ card licensed by Toshiba Corporation. However, in general, the contact 504 provides an interface between the memory module 500 and the host having receptors compatible with the contact 504 for the control operation, address operation and/or data signal transmission. The memory module 500 may optionally include an additional circuit 510, such as at least one integrated circuit and/or discrete components. In some example embodiments, the additional circuit 510 may include a memory controller to control an access over a plurality of flash memory devices 100 and/or to provide a translation layer between an external host and the flash memory device 100. For example, there may be no one-to-one correspondence between the number of contacts 504 and the number of accesses to at least one flash memory device 100. Therefore, the memory controller may receive a relevant signal from a relevant I/O connection at a relevant time or may selectively connect the I/O connection of the flash memory device 100 to provide the relevant signal from the relevant I/O connection at the relevant time. In the same manner, the communication protocol between the host and the memory module 500 may be different from the communication protocol required for access to the flash memory device 100. The memory controller can convert the command sequences received from the host into the relevant command sequences to achieve the desired access to the flash memory device 100. The conversion may include variation of the signal voltage level as sell as the command sequence. The additional circuit 510 may include other functions beyond the control of the flash memory device 100, such as the logic functions performed by ASIC. In addition, the additional circuit 510 may include a circuit that restricts the read or write access to the memory module, such as password protection or biometrics. The additional circuit 510 may include a circuit representing the status of the memory module 500. For example, the additional circuit 510 may include a display function to display the status of the memory module 500. In detail, the additional circuit 510 may determine whether the power is supplied to the memory module 500 or whether the memory module 500 is currently accessed to display a solid light when the power is supplied or a flashing light when the memory module 500 is accessed. The additional circuit 510 may further include a passive element, such as a decoupling capacitor, to adjust the power condition in the memory module 500

The nonvolatile memory device according to example embodiments may be implemented with various packages. For example, the nonvolatile memory device may be mounted using the packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabriated Package (WFP), Wafer-Level Processed Stack Package (WSP), etc.

The inventive concept may be applied to various nonvolatile memory devices to reduce the word line coupling and enhancing the reliability of the read and write operations thereof. Particularly the inventive concept may be applied usefully to a flash memory device and a system including a flash memory device in which the word line coupling may be a factor.

The foregoing is illustrative of example embodiments and is not to be construed as limiting thereof. Although a few example embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined by the claims.

What is claimed is:

1. A method of programming in a nonvolatile memory device, the nonvolatile memory device including a plurality of memory cells that are programmed into multiple states through at least two program steps, the method comprising:
   performing a primary program from an erase level to a first target level with respect to the memory cells coupled to a selected word line;
   performing a preprogram from the erase level to a preprogram level in association with the primary program with respect to the memory cells coupled to the selected word line, the preprogram level being larger than the erase level and smaller than the first target level; and
   performing a secondary program from the preprogram level to a second target level with respect to the preprogrammed memory cells coupled to the selected word line.

2. The method of claim 1, wherein a distribution range of a threshold voltage of preprogrammed memory cells is larger than a word line coupling gain and smaller than a value that is obtained by subtracting a word line coupling limit margin width from a maximum value of the second target level.

3. The method of claim 1, wherein the preprogram is performed using a program pulse of a first program loop for performing the primary program.

4. The method of claim 1, wherein the preprogram is performed using a preprogram pulse that is added before a program pulse of a first program loop for performing the primary program.

5. The method of claim 1, wherein the preprogram is performed using a first program loop for performing the primary program.

6. The method of claim 1, wherein the preprogram is performed using one or more preprogram loops that are added before a first program loop for performing the primary program.

7. The method of claim 6, wherein each preprogram loop includes programming the preprogrammed memory cells using a preprogram pulse and verifying program states of the preprogrammed memory cells using a verify pulse, and the preprogram is inhibited with respect to the preprogrammed memory cells having a threshold voltage level higher than a verify level of the verify pulse.

8. The method of claim 1, further comprising:
performing the primary program and the preprogram with respect to the memory cells coupled to an adjacent word line, after performing the primary program and the preprogram with respect to the memory cells coupled to an adjacent word line and before performing the secondary program with respect to the preprogrammed memory cells coupled to the selected word line.

9. The method of claim 8, further comprising:
performing the secondary program with respect to the preprogrammed memory cells coupled to the adjacent word line, after programming is completed with respect to the memory cells coupled to the selected word line.

10. A method of programming in a nonvolatile memory device, the nonvolatile memory device including a plurality of memory cells that are programmed into multiple states through at least two program steps, the method comprising:
performing a primary program from an erase level to a first target level with respect to the memory cells coupled to a first word line;
performing a preprogram from the erase level to a preprogram level in association with the primary program with respect to the memory cells coupled to the first word line, the preprogram level being larger than the erase level and smaller than the first target level; and
performing the primary program with respect to the memory cells coupled to a second word line adjacent to the first word line; and
performing the preprogram with respect to the memory cells coupled to the second word line.

11. The method of claim 10, further comprising:
performing a secondary program from the preprogram level to a second target level with respect to the preprogrammed memory cells coupled to the first word line, after performing the primary program and the preprogram with respect to the memory cells coupled to the second word line.

12. A device comprising:
a memory controller configured for connection to a nonvolatile memory including a plurality of non-volatile multi-level memory cells (MLC), the memory controller configured to determine a multi-level cell to undergo a maximum variation of threshold voltage during a programming operation to the multi-level cell and the memory controller configured to pre-program the multi-level cell from an erased state having an erased state distribution of threshold voltages to a pre-programmed state having a pre-programmed distribution of threshold voltages that is greater than the erased state distribution of threshold voltages,
wherein the memory controller is further configured to primary program of the multi-level cell addressed by a wordline from an erase level to a first target level and configured to preprogram from the erase level to am level in association with the primary program wherein the preprogram level is larger than the erase level and less than the first target level and configured to secondary program from the preprogram level to a second target level.

13. The device of claim 12, wherein a distribution range of a threshold voltage of preprogrammed memory cells is greater than a word line coupling gain and less than a value that is obtained by subtracting a word line coupling limit margin width from a maximum value of the second target level.

14. The device of claim 12, wherein the memory controller is configured to preprogram using a program pulse of a first program loop in the primary program.

15. The device of claim 12, wherein the memory controller is configured to preprogram using a preprogram pulse that is added before a program pulse of a first program loop in the primary program.

16. The device of claim 12, wherein the memory controller is configured to preprogram using a first program loop in the primary program.

17. The device of claim 12, wherein the memory controller is configured to preprogram using one or more preprogram loops that are added before a first program loop in the primary program.

18. The device of claim 17, wherein the memory controller is configured, in each preprogram loop, to program the preprogrammed memory cells using a preprogram pulse and to verify program states of the preprogrammed memory cells using a verify pulse, wherein the preprogram is inhibited with respect to the preprogrammed memory cells having a threshold voltage level greater than a verify level of the verify pulse.

19. The device of claim 12, wherein the memory controller is further configured to primary program and preprogram with respect to the memory cells connected to an unaddressed adjacent word line, after performing the primary program and the preprogram with respect to the memory cells connected to an unaddressed adjacent word line and before performing the secondary program with respect to the preprogrammed memory cells connected to the selected word line.

* * * * *